United States Patent
Horsky et al.

(10) Patent No.: US 7,629,590 B2
(45) Date of Patent: *Dec. 8, 2009

(54) METHOD AND APPARATUS FOR EXTENDING EQUIPMENT UPTIME IN ION IMPLANTATION

(75) Inventors: Thomas N. Horsky, Boxborough, MA (US); Robert W. Milgate, III, Gloucester, MA (US); George P. Sacco, Jr., Topsfield, MA (US); Dale C. Jacobson, Salem, NH (US); Wade A. Krull, Marblehead, MA (US)

(73) Assignee: Semequip, Inc., North Billerica, MA (US)

( * ) Notice: Subject to any disclaimer, the term of this patent is extended or adjusted under 35 U.S.C. 154(b) by 101 days.

This patent is subject to a terminal disclaimer.

(21) Appl. No.: 11/647,714

(22) Filed: Dec. 29, 2006

(65) Prior Publication Data

US 2008/0121811 A1 May 29, 2008

Related U.S. Application Data

(63) Continuation of application No. 10/582,392, filed as application No. PCT/US2004/041525 on Dec. 9, 2004.

(60) Provisional application No. 60/529,343, filed on Dec. 12, 2003.

(51) Int. Cl.
   *H01J 27/02* (2006.01)
   *H01J 27/00* (2006.01)
   *H01J 7/24* (2006.01)
(52) U.S. Cl. .............. 250/423 R; 250/424; 250/492.3; 315/111.21; 315/111.31
(58) Field of Classification Search .......... 250/423 R, 250/424, 425, 430, 492.3; 315/111.21, 111.31, 315/111.71, 113.91
See application file for complete search history.

(56) References Cited

U.S. PATENT DOCUMENTS 4,105,916 A 8/1978 Siegel (Continued)

FOREIGN PATENT DOCUMENTS

EP 0140975 5/1985

(Continued)

OTHER PUBLICATIONS

U.S. Appl. No. 11/647,898, Horsky et al.

(Continued)

*Primary Examiner*—Bernard E Souw
(74) *Attorney, Agent, or Firm*—John S. Paniaguas; Katten Muchin Rosenman LLP

(57) ABSTRACT

The service lifetime of an ion source is enhanced or prolonged by the source having provisions for in-situ etch cleaning of the ion source and of an extraction electrode, using reactive halogen gases, and by having features that extend the service duration between cleanings. The latter include accurate vapor flow control, accurate focusing of the ion beam optics, and thermal control of the extraction electrode that prevents formation of deposits or prevents electrode destruction. An apparatus comprised of an ion source for generating dopant ions for semiconductor wafer processing is coupled to a remote plasma source which delivers F or Cl ions to the first ion source for the purpose of cleaning deposits in the first ion source and the extraction electrode. These methods and apparatus enable long equipment uptime when running condensable feed gases such as sublimated vapor sources, and are particularly applicable for use with so-called cold ion sources. Methods and apparatus are described which enable long equipment uptime when decaborane and octadecaborane are used as feed materials, as well as when vaporized elemental arsenic and phosphorus are used, and which serve to enhance beam stability during ion implantation.

22 Claims, 21 Drawing Sheets

U.S. PATENT DOCUMENTS

| | | | |
|---|---|---|---|
| 4,254,340 A | 3/1981 | Camplan et al. | |
| 4,409,486 A | 10/1983 | Bates | |
| 4,412,900 A | 11/1983 | Tanaka et al. | |
| 4,512,812 A | 4/1985 | Liebert et al. | |
| 4,529,474 A | 7/1985 | Fujiyama et al. | |
| 4,619,844 A | 10/1986 | Pierce et al. | |
| 4,640,221 A | 2/1987 | Barbee et al. | |
| 4,657,616 A | 4/1987 | Benzing et al. | |
| 4,665,315 A | 5/1987 | Bacchetti et al. | |
| 4,703,183 A | 10/1987 | Guerra | |
| 4,723,967 A | 2/1988 | Tom | |
| 4,738,693 A | 4/1988 | Tom | |
| 4,786,352 A | 11/1988 | Benzing | |
| 4,851,668 A * | 7/1989 | Ohno et al. | 250/251 |
| 4,958,078 A | 9/1990 | Becchetti | |
| 4,960,488 A | 10/1990 | Law et al. | |
| 4,983,850 A | 1/1991 | Tsukakoshi et al. | |
| 5,028,791 A | 7/1991 | Koshiishi et al. | |
| 5,049,784 A | 9/1991 | Matsudo | |
| 5,083,061 A | 1/1992 | Koshiishi et al. | |
| 5,089,747 A | 2/1992 | Koshiishi et al. | |
| 5,097,179 A | 3/1992 | Takayama | |
| 5,101,110 A | 3/1992 | Matsudo et al. | |
| 5,129,958 A | 7/1992 | Nagashima et al. | |
| 5,132,545 A | 7/1992 | Shono et al. | |
| 5,144,147 A | 9/1992 | Shiozaki et al. | |
| 5,158,644 A | 10/1992 | Cheung et al. | |
| 5,186,120 A | 2/1993 | Ohnishi et al. | |
| 5,206,516 A | 4/1993 | Keller et al. | |
| 5,216,330 A | 6/1993 | Ahonen | |
| 5,262,652 A | 11/1993 | Bright et al. | |
| 5,279,129 A | 1/1994 | Ito | |
| 5,281,302 A | 1/1994 | Gabric et al. | |
| 5,296,713 A | 3/1994 | Tanaka | |
| 5,306,921 A | 4/1994 | Tanaka et al. | |
| 5,312,519 A | 5/1994 | Sakai et al. | |
| 5,350,926 A | 9/1994 | White et al. | |
| 5,354,698 A | 10/1994 | Cathey, Jr. | |
| 5,362,328 A | 11/1994 | Gardiner et al. | |
| 5,369,279 A | 11/1994 | Martin | |
| 5,429,070 A | 7/1995 | Campbell et al. | |
| 5,451,258 A | 9/1995 | Hillman et al. | |
| 5,466,942 A | 11/1995 | Sakai et al. | |
| 5,486,235 A | 1/1996 | Ye et al. | |
| 5,489,550 A | 2/1996 | Moslehi | |
| 5,497,006 A | 3/1996 | Sferlazzo | |
| 5,536,330 A | 7/1996 | Chen et al. | |
| 5,554,854 A * | 9/1996 | Blake | 250/492.21 |
| 5,576,538 A | 11/1996 | Sakai et al. | |
| 5,616,208 A | 4/1997 | Lee | |
| 5,633,506 A * | 5/1997 | Blake | 250/492.21 |
| 5,661,308 A | 8/1997 | Benveniste et al. | |
| 5,676,759 A | 10/1997 | Ye et al. | |
| 5,685,916 A | 11/1997 | Ye et al. | |
| 5,700,327 A | 12/1997 | Babacz et al. | |
| 5,714,738 A | 2/1998 | Hauschulz et al. | |
| 5,747,936 A | 5/1998 | Harrison et al. | |
| 5,751,002 A | 5/1998 | Ogata et al. | |
| 5,779,849 A | 7/1998 | Blalock | |
| 5,780,863 A | 7/1998 | Benveniste et al. | |
| 5,785,796 A | 7/1998 | Lee | |
| 5,788,778 A | 8/1998 | Shang et al. | |
| 5,824,375 A | 10/1998 | Gupta | |
| 5,832,177 A | 11/1998 | Shinagawa et al. | |
| 5,843,239 A | 12/1998 | Shrotriya | |
| 5,882,416 A | 3/1999 | Van Buskirk et al. | |
| 5,883,364 A | 3/1999 | Frei et al. | |
| 5,883,391 A | 3/1999 | Adibi et al. | |
| 5,886,355 A | 3/1999 | Bright et al. | |
| 5,932,882 A | 8/1999 | England et al. | |
| 5,940,724 A | 8/1999 | Warren | |
| 5,993,766 A | 11/1999 | Tom et al. | |
| 6,013,332 A | 1/2000 | Goto et al. | |
| 6,060,034 A | 5/2000 | Tsukamoto | |
| 6,068,729 A | 5/2000 | Shrotriya | |
| 6,093,625 A | 7/2000 | Wagner et al. | |
| 6,094,012 A | 7/2000 | Leung et al. | |
| 6,107,634 A | 8/2000 | Horsky | |
| 6,130,436 A | 10/2000 | Renau et al. | |
| 6,143,084 A | 11/2000 | Li et al. | |
| 6,150,628 A | 11/2000 | Smith et al. | |
| 6,160,262 A | 12/2000 | Aoki et al. | |
| 6,178,952 B1 | 1/2001 | Lammerts et al. | |
| 6,184,532 B1 | 2/2001 | Dudnikov et al. | |
| 6,221,169 B1 | 4/2001 | Bernstein et al. | |
| 6,242,750 B1 | 6/2001 | Takahashi et al. | |
| 6,253,783 B1 | 7/2001 | Carlsen et al. | |
| 6,259,105 B1 | 7/2001 | Eddy et al. | |
| 6,271,529 B1 | 8/2001 | Farley et al. | |
| 6,288,403 B1 | 9/2001 | Horsky et al. | |
| 6,313,475 B1 | 11/2001 | Renau et al. | |
| 6,335,534 B1 | 1/2002 | Suguro et al. | |
| 6,338,312 B2 | 1/2002 | Hayes et al. | |
| 6,355,933 B1 | 3/2002 | Tripsas et al. | |
| 6,423,976 B1 | 7/2002 | Glavish et al. | |
| 6,441,382 B1 | 8/2002 | Huang | |
| 6,449,521 B1 | 9/2002 | Gupta | |
| 6,452,198 B1 | 9/2002 | Mani et al. | |
| 6,452,338 B1 | 9/2002 | Horsky | |
| 6,464,891 B1 | 10/2002 | Druz et al. | |
| 6,479,828 B2 | 11/2002 | Perel | |
| 6,486,431 B1 | 11/2002 | Smith et al. | |
| 6,489,622 B1 | 12/2002 | Chen et al. | |
| 6,498,348 B2 | 12/2002 | Aitken | |
| 6,528,804 B1 | 3/2003 | Sullivan et al. | |
| 6,545,419 B2 | 4/2003 | Vella | |
| 6,559,462 B1 | 5/2003 | Carpenter et al. | |
| 6,583,544 B1 | 6/2003 | Horsky et al. | |
| 6,614,033 B2 | 9/2003 | Suguro et al. | |
| 6,617,593 B2 | 9/2003 | Lien | |
| 6,620,256 B1 | 9/2003 | Arno et al. | |
| 6,639,227 B1 | 10/2003 | Glavish et al. | |
| 6,653,643 B2 | 11/2003 | Saadatmand et al. | |
| 6,664,547 B2 | 12/2003 | Benveniste | |
| 6,670,623 B2 | 12/2003 | Vella | |
| 6,670,624 B1 | 12/2003 | Adams et al. | |
| 6,686,595 B2 * | 2/2004 | Horsky | 250/427 |
| 6,686,601 B2 | 2/2004 | Murrell et al. | |
| 6,703,628 B2 | 3/2004 | Ye et al. | |
| 6,710,358 B1 | 3/2004 | Chen et al. | |
| 6,712,084 B2 | 3/2004 | Shajii et al. | |
| 6,740,586 B1 | 5/2004 | Wang et al. | |
| 6,768,121 B2 | 7/2004 | Horsky et al. | |
| 6,770,888 B1 | 8/2004 | Benveniste et al. | |
| 6,772,776 B2 | 8/2004 | Klebanoff et al. | |
| 6,777,696 B1 | 8/2004 | Rathmell et al. | |
| 6,818,909 B2 | 11/2004 | Murrell et al. | |
| 6,830,631 B2 | 12/2004 | Nenyei et al. | |
| 6,835,930 B2 | 12/2004 | Benveniste et al. | |
| 6,841,141 B2 | 1/2005 | Arno et al. | |
| 6,852,242 B2 | 2/2005 | Sun et al. | |
| 6,885,014 B2 | 4/2005 | Benveniste | |
| 6,885,812 B2 | 4/2005 | Groom | |
| 6,909,102 B1 | 6/2005 | Buccos | |
| 6,909,839 B2 | 6/2005 | Wang et al. | |
| 6,921,062 B2 | 7/2005 | Gregg et al. | |
| 6,946,667 B2 | 9/2005 | Chen et al. | |
| 6,956,225 B1 | 10/2005 | Benveniste | |
| 6,958,481 B2 | 10/2005 | Horsky et al. | |
| 6,974,957 B2 | 12/2005 | Glukhoy | |
| 6,992,311 B1 | 1/2006 | Ring et al. | |
| 7,022,999 B2 | 4/2006 | Horsky et al. | |
| 7,107,929 B2 | 9/2006 | Horsky et al. | |
| 7,112,804 B2 | 9/2006 | Horsky et al. | |

| | | | |
|---|---|---|---|
| 7,185,602 B2 | 3/2007 | Horsky et al. | |
| 7,531,819 B2 * | 5/2009 | DiVergilio et al. | 250/492.21 |
| 2003/0030010 A1 | 2/2003 | Perel et al. | |
| 2003/0111014 A1 | 6/2003 | Donatucci et al. | |
| 2003/0230986 A1 | 12/2003 | Horsky et al. | |
| 2004/0000647 A1 * | 1/2004 | Horsky | 250/427 |
| 2004/0002202 A1 | 1/2004 | Horsky | |
| 2004/0104682 A1 | 6/2004 | Horsky et al. | |
| 2004/0175160 A1 | 9/2004 | Groom | |
| 2004/0188631 A1 | 9/2004 | Horsky et al. | |
| 2005/0051096 A1 | 3/2005 | Horsky et al. | |
| 2005/0169828 A1 | 8/2005 | Spielvogel et al. | |
| 2005/0178975 A1 | 8/2005 | Glukhoy | |
| 2005/0202657 A1 | 9/2005 | Borland et al. | |
| 2005/0258380 A1 | 11/2005 | White et al. | |
| 2005/0269520 A1 | 12/2005 | Horsky et al. | |
| 2005/0277246 A1 | 12/2005 | Kirkpatrick et al. | |
| 2006/0017010 A1 | 1/2006 | Vanderberg et al. | |
| 2006/0097193 A1 | 5/2006 | Horsky et al. | |
| 2006/0097645 A1 * | 5/2006 | Horsky | 315/111.81 |
| 2006/0237663 A1 | 10/2006 | Balogh | |
| 2006/0272775 A1 * | 12/2006 | Horsky et al. | 156/345.37 |
| 2006/0272776 A1 * | 12/2006 | Horsky et al. | 156/345.37 |
| 2007/0107841 A1 | 5/2007 | Horsky et al. | |
| 2007/0108394 A1 | 5/2007 | Horsky | |
| 2007/0108395 A1 * | 5/2007 | Horsky et al. | 250/489 |
| 2007/0170372 A1 * | 7/2007 | Horsky | 250/427 |
| 2007/0210260 A1 * | 9/2007 | Horsky et al. | 250/424 |
| 2007/0241689 A1 * | 10/2007 | Horsky et al. | 315/111.91 |
| 2007/0262262 A1 | 11/2007 | Horsky et al. | |
| 2007/0278417 A1 | 12/2007 | Horsky et al. | |
| 2008/0042580 A1 * | 2/2008 | Horsky | 315/111.81 |
| 2008/0047607 A1 * | 2/2008 | Horsky et al. | 137/8 |
| 2008/0087219 A1 * | 4/2008 | Horsky | 118/698 |
| 2008/0121811 A1 * | 5/2008 | Horsky et al. | 250/424 |
| 2008/0223409 A1 * | 9/2008 | Horsky et al. | 134/22.1 |

FOREIGN PATENT DOCUMENTS

| | | |
|---|---|---|
| EP | 0474108 | 3/1992 |
| EP | 0555546 | 8/1993 |
| EP | 0648861 | 4/1995 |
| EP | 0697467 | 2/1996 |
| EP | 0762469 | 3/1997 |
| EP | 0954008 A2 | 11/1999 |
| EP | 1061550 A2 | 12/2000 |
| JP | 55-145338 | 11/1980 |
| JP | 56-026539 | 3/1981 |
| JP | 56-166935 | 12/1981 |
| JP | 61-135037 | 6/1986 |
| JP | 02-155147 | 6/1990 |
| JP | 06-084837 | 3/1994 |
| JP | 2000323051 | 11/2000 |
| WO | WO 96/15545 | 5/1996 |
| WO | WO 2004/003973 A3 | 1/2004 |
| WO | WO 2005/059942 A2 | 6/2005 |

OTHER PUBLICATIONS

U.S. Appl. No. 10/183,768, filed Jun. 26, 2002.
U.S. Appl. No. 12/105,702.
E.J. Collart et al. "Co-Implantation with Conventional Spike Anneal Solutions for 45 nm Ultra-Shallow Junction Formation", Proceedings of the Eight International Workshop on: Fabrication, Characterization and Modeling Of Ultra-Shallow Doping Profiles in Semiconductors, Jun. 2005, p. 327.
S Rizk et al. "Modeling the Suppression Boron Diffusion in Si/SiGe Due to Carbon Incorporation", ibid, p. 315.
L. S. Robertson et al., "The Effect of Impurities and Activation of Ion Implanted boron in Silicon", Mat. Res. Soc. Symp. vol. 610, pp. B5.8.1-B5.8.6 (2000).
U.S. Appl. No. 12/234,902, filed Sep. 19, 2008, Horsky.
Mare E. Law et al., "Influence of Carbon on the diffusion of Interstitials and Boron in Silicon", ibid, pp. B7.4.1-B7.4.5.
P. A. Stolk et al., "Understanding and Controlling Transient Enhanced Dopant Diffusion in Silicon", Mat. Res. Soc. Symp. Proc. vol. 354, pp. 307-318 (1995).
M. Ueda et al., "High Dose Nitrogen and Carbon Shallow Implantation in Si by Plasma Immersion Ion Implantation", Nuclear Instruments and Methods in Physics Research B 175-177 (2001) pp. 715-720.
Jorg K. N. Lindner et al., "Ion Beam Synthesis of Buried SiC Layers in Silicon: Basic Physical Processes", Nuclear Instruments and Methods Research B 178 (2001) pp. 44-54.
K. N. Lindner et al., "Mechanisms of SiC Formation in the Ion Beam Synthesis of 3 C—SiC Layers in Silicon", Materials Science Forum vols. 264-268 (1998) pp. 215-218.
Kah-Wee An et al., "Thin body Silicon-on-insulator N-MOSFET with Silicon-Carbon Source/Drain Regions for Performance Enhancement", IEDM Workshop, Washington, D.C., Dec. 2005.
Masahiro et al., "B—SiC Formation by Low-Energy Ion-Doping Technique", Japanese Journal of Applied Physics vol. 29, No. 8, Aug. 1990, pp. L 1493-L 1496.

* cited by examiner

METHOD AND APPARATUS FOR EXTENDING EQUIPMENT UPTIME IN ION IMPLANTATION

CROSS REFERENCE TO RELATED APPLICATIONS

This patent application is a continuation of U.S. patent application Ser. No. 10/582,392, filed on Jun. 23, 2006, which is a U.S. national phase application under 35 U.S.C. §371 of International Patent Application PCT/US2004/041525, filed Dec. 9, 2004, which claims priority to and the benefit of U.S. Provisional Patent Application No. 60/529,343, filed Dec. 12, 2003.

FIELD OF THE INVENTION

The present invention relates to producing ion beams in which one or more gaseous or vaporized feed materials is ionized in an ion source. It also relates to a method and apparatus for operating an ion source to produce an ion beam for ion implantation of semiconductor substrates and substrates for flat panel displays. In particular the invention concerns extension of the productive time (i.e. the "uptime") of systems that produce ion beams.

BACKGROUND

Ion beams are produced from ions extracted from an ion source. An ion source typically employs an ionization chamber connected to a high voltage power supply. The ionization chamber is associated with a source of ionizing energy, such as an arc discharge, energetic electrons from an electron-emitting cathode, or a radio frequency or microwave antenna, for example. A source of desired ion species is introduced into the ionization chamber as a feed material in gaseous or vaporized form where it is exposed to the ionizing energy. Extraction of resultant ions from the chamber through an extraction aperture is based on the electric charge of the ions. An extraction electrode is situated outside of the ionization chamber, aligned with the extraction aperture, and at a voltage below that of the ionization chamber. The electrode draws the ions out, typically forming an ion beam. Depending upon desired use, the beam of ions may be mass-analyzed for establishing mass and energy purity, accelerated, focused and subjected to scanning forces. The beam is then transported to its point of use, for example into a processing chamber. As the result of the precise energy qualities of the ion beam, its ions may be implanted with high accuracy at desired depth into semiconductor substrates.

The precise qualities of the ion beam can be severely affected by condensation and deposit of the feed material or of its decomposition products on surfaces of the ion beam-producing system, and in particular surfaces that affect ionization, ion extraction and acceleration.

The Ion Implantation Process

The conventional method of introducing a dopant element into a semiconductor wafer is by introduction of a controlled energy ion beam for ion implantation. This introduces desired impurity species into the material of the semiconductor substrate to form doped (or "impurity") regions at desired depth. The impurity elements are selected to bond with the semiconductor material to create electrical carriers, thus altering the electrical conductivity of the semiconductor material. The electrical carriers can either be electrons (generated by N-type dopants) or "holes" (i.e., the absence of an electron), generated by P-type dopants. The concentration of dopant impurities so introduced determines the electrical conductivity of the doped region. Many such N- and P-type impurity regions must be created to form transistor structures, isolation structures and other such electronic structures, which collectively function as a semiconductor device.

To produce an ion beam for ion implantation, a gas or vapor feed material is selected to contain the desired dopant element. The gas or vapor is introduced into the evacuated high voltage ionization chamber while energy is introduced to ionize it. This creates ions which contain the dopant element (for example, in silicon the elements As, P, and Sb are donors or N-type dopants, while B and In are acceptors or P-type dopants). An accelerating electric field is provided by the extraction electrode to extract and accelerate the typically positively-charged ions out of the ionization chamber, creating the desired ion beam. When high purity is required, the beam is transported through mass analysis to select the species to be implanted, as is known in the art. The ion beam is ultimately transported to a processing chamber for implantation into the semiconductor wafer.

Similar technology is used in the fabrication of flat-panel displays (FPD's) which incorporate on-substrate driver circuitry to operate the thin-film transistors which populate the displays. The substrate in this case is a transparent panel such as glass to which a semiconductor layer has been applied. Ion sources used in the manufacturing of FPD's are typically physically large, to create large-area ion beams of boron, phosphorus and arsenic-containing materials, for example, which are directed into a chamber containing the substrate to be implanted. Most FPD implanters do not mass-analyze the ion beam prior to its reaching the substrate.

Ion Contamination

In general, ion beams of N-type dopants such as P or As should not contain any significant portion of P-type dopant ions, and ion beams of P-type dopants such as B or In should not contain any significant portion of N-type dopant ions. Such a condition is called "cross-contamination" and is undesirable. Cross-contamination can occur when source feed materials accumulate in the ion source, and the source feed material is then changed, for example, when first running elemental phosphorus feed material to generate an N-type $P^+$ beam, and then switching to $BF_3$ gas to generate a P-type $BF_2^+$ beam.

A serious contamination effect occurs when feed materials accumulate within the ion source so that they interfere with the successful operation of the source. Such a condition invariably has called for removal of the ion source and the extraction electrode for cleaning or replacement, resulting in an extended "down" time of the entire ion implantation system, and consequent loss of productivity.

Many ion sources used in ion implanters for device wafer manufacturing are "hot" sources, that is, they operate by sustaining an arc discharge and generating a dense plasma; the ionization chamber of such a "hot" source can reach an operating temperature of 800C or higher, in many cases substantially reducing the accumulation of solid deposits. In addition, the use of $BF_3$ in such sources to generate boron-containing ion beams further reduces deposits, since in the generation of a $BF_3$ plasma, copious amounts of fluorine ions are generated; fluorine can etch the walls of the ion source, and in particular, recover deposited boron through the chemical production of gaseous $BF_3$. With other feed materials, however, detrimental deposits have formed in hot ion sources. Examples include antimony (Sb) metal, and solid indium (In), the ions of which are used for doping silicon substrates.

Cold ion sources, for example the RF bucket-type ion source which uses an immersed RF antenna to excite the source plasma (see, for example, Leung et al., U.S. Pat. No. 6,094,012, herein incorporated by reference), are used in applications where either the design of the ion source includes permanent magnets which must be kept below their Curie temperature, or the ion source is designed to use thermally-sensitive feed materials which break down if exposed to hot surfaces, or where both of these conditions exist. Cold ion sources suffer more from the deposition of feed materials than do hot sources. The use of halogenated feed materials for producing dopants may help reduce deposits to some extent, however, in certain cases, non-halogen feed materials such as hydrides are preferred over halogenated compounds. For non-halogen applications, ion source feed materials such as gaseous $B_2H_6$, $AsH_3$, and $PH_3$ are used. In some cases, elemental As and P are used, in vaporized form. The use of these gases and vapors in cold ion sources has resulted in significant materials deposition and has required the ion source to be removed and cleaned, sometimes frequently. Cold ion sources which use $B_2H_6$ and $PH_3$ are in common use today in FPD implantation tools. These ion sources suffer from cross-contamination (between N- and P-type dopants) and also from particle formation due to the presence of deposits. When transported to the substrate, particles negatively impact yield. Cross-contamination effects have historically forced FPD manufacturers to use dedicated ion implanters, one for N-type ions, and one for P-type ions, which has severely affected cost of ownership.

Borohydrides

Borohydride materials such as $B_{10}H_{14}$ (decaborane) and $B_{18}H_{22}$ (octadecaborane) have attracted interest as ion implantation source materials. Under the right conditions, these materials form the ions $B_{10}H_x^+$, $B_{10}H_x^-$, $B_{18}H_x^+$, and $B_{18}H_x^-$. When implanted, these ions enable very shallow, high dose P-type implants for shallow junction formation in CMOS manufacturing. Since these materials are solid at room temperature, they must be vaporized and the vapor introduced into the ion source for ionization. They are low-temperature materials (e.g., decaborane melts at 100C, and has a vapor pressure of approximately 0.2 Torr at room temperature; also, decaborane dissociates above 350C), and hence must be used in a cold ion source. They are fragile molecules which are easily dissociated, for example, in hot plasma sources.

Contamination Issues of Borohydrides

Boron hydrides such as decaborane and octadecaborane present a severe deposition problem when used to produce ion beams, due to their propensity for readily dissociating within the ion source. Use of these materials in Bernas-style arc discharge ion sources and also in electron-impact ("soft") ionization sources, have confirmed that boron-containing deposits accumulate within the ion sources at a substantial rate. Indeed, up to half of the borohydride vapor introduced into the source may stay in the ion source as dissociated, condensed material. Eventually, depending on the design of the ion source, the buildup of condensed material interferes with the operation of the source and necessitates removal and cleaning of the ion source.

Contamination of the extraction electrode has also been a problem when using these materials. Both direct ion beam strike and condensed vapor can form layers that degrade operation of the ion beam formation optics, since these boron-containing layers appear to be electrically insulating. Once an electrically insulating layer is deposited, it accumulates electrical charge and creates vacuum discharges, or so-called "glitches", upon breakdown. Such instabilities affect the precision quality of the ion beam and can contribute to the creation of contaminating particles.

SUMMARY OF THE INVENTION

It is an object of this invention to provide a method and apparatus for producing an ion beam which increases service lifetime and reduces equipment down time.

The invention features in-situ cleaning procedures and apparatus for an ion source and associated extraction electrodes and similar components of the ion-beam producing system, which periodically chemically remove deposits, increasing service lifetime and performance, without the need to disassemble the system.

The invention also features an actively heated ion extraction electrode which consists of a material which reduces the frequency and occurrence of electrical discharges, preferably this material being a metal.

Another feature is, in general, heating an extraction electrode above the condensation temperature of feed materials to an ion source, in preferred cases the electrode being comprised of metal, preferably aluminum or molybdenum.

The invention also features steps and construction features that improve the production and utilization of ions. This reduces the required concentration of feed material in the ion source, and in related manner, reduces the rate of accumulation of detrimental deposits on surfaces of the ion-beam producing system.

These and other innovations of the invention may include one or more of the following features:

A supply of a reactive gas is provided and introduced into the ion source, and the ion source is cleaned in situ through exposure to reactive products from that supply such as atomic fluorine, F, or molecular fluorine, $F_2$; the atomic or molecular fluorine is injected into the ion source from a remote plasma source; the ion source is cleaned through exposure to gaseous $ClF_3$ flowing from a remote supply; reactive components of the ionization apparatus are shielded from reactive gas during the cleaning phase of operation; the ion source is fabricated of aluminum; the extraction electrode is fabricated of aluminum; the front face of the extraction electrode is devoid of sharp or rough features; the plates of the extraction electrode are actively temperature controlled; the plates of the extraction electrode are actively heated; heating of the extraction electrode is radiative or is resistive; the plates of the extraction electrode in other situations are actively cooled.

Another feature is the use of the features described with apparatus suitable to form "cluster" or "molecular" ion beams, of feed material that is particularly subject to thermal breakdown and deposit.

While most ion implantation experts would agree that the use of borohydrides to form "cluster" ion beams such as $B_{10}H_x^+$ and $B_{18}H_x^+$ is very attractive for shallow junction formation, means to ionize and transport these large molecules have presented problems. For example, U.S. Pat. Nos. 6,288,403 and 6,452,338 describe ion sources which have successfully produced decaborane ion beams. However, such decaborane ion sources have been found to exhibit particularly short service life as compared to other commercial ion sources used in ion implantation. This short service life has been primarily due to the accumulation of boron-containing deposits within the ion source, and the deposition of insulating coatings on the ion extraction electrode, which has lead to beam instabilities requiring implanter shut down and maintenance.

According to another feature, means are provided to substantially reduce the deposition of such deposits in the borohydride ion source and on the ion extraction electrode, and means are provided to clean deposits on these components without removing them from the ion implanter, i.e., in-situ. This invention enables the commercial use of borohydride cluster beams in semiconductor manufacturing with long service lifetime.

A particular aspect of the invention is a system for generating an ion beam comprising an ion source in combination with an extraction electrode and a reactive gas cleaning system, the ion source comprising an ionization chamber connected to a high voltage power supply and having an inlet for gaseous or vaporized feed materials, an energizeable ionizing system for ionizing the feed material within the ionization chamber and an extraction aperture that communicates with a vacuum housing, the vacuum housing evacuated by a vacuum pumping system, the extraction electrode disposed in the vacuum housing outside of the ionization chamber, aligned with the extraction aperture of the ionization chamber and adapted to be maintained at a voltage below that of the ionization chamber to extract ions through the aperture from within the ionization chamber, and the reactive gas cleaning system operable when the ionization chamber and ionizing system are de-energized to provide a flow of reactive gas through the ionization chamber and through the ion extraction aperture to react with and remove deposits on at least some of the surfaces of the ion generating system.

Preferred embodiments of this aspect have one or more of the following features.

The system is constructed for use in implanting ions in semiconductor wafers, the ionization chamber having a volume less than about 100 ml and an internal surface area of less than about 200 $cm^2$.

The system is constructed to produce a flow of the reactive gas into the ionization chamber at a flow rate of less than about 2 Standard Liters Per Minute.

The extraction electrode is constructed to produce a beam of accelerated ions suitable for transport to a point of utilization.

The extraction electrode is located within a path of reactive gas moving from the extraction aperture to the vacuum pumping system so that the extraction electrode is cleaned by the reactive gas.

The extraction electrode is associated with a heater to maintain the electrode at elevated temperature during extraction by the extraction electrode of ions produced in the ionization chamber, e.g. above the condensation temperature, below the disassociation temperature, of solid-derived, thermally sensitive vapors.

The extraction electrode is associated with a cooling device, e.g. when the electrode is formed of thermally sensitive material and is used with a hot ion source.

The extraction electrode has a smooth, featureless aspect.

The reactive gas cleaning system comprises a plasma chamber, the plasma chamber arranged to receive a feed gas capable of being disassociated by plasma to produce a flow of reactive gas through a chamber outlet, and a conduit for transporting the reactive gas to the ionization chamber.

The plasma chamber is constructed and arranged to receive and disassociate a compound capable of being disassociated to atomic fluorine, for instance $NF_3$, $C_3F_8$ or $CF_4$.

The reactive gas cleaning system is constructed and arranged to share a service facility associated with the ion source.

The system is constructed to direct an ion beam through a mass analyzer, in which the reactive gas cleaning system is constructed and arranged to share a service facility with the mass analyzer.

The reactive gas cleaning system comprises a conduit from a container of pressurized reactive gas, for instance $ClF_3$.

The system is in combination with an end-point detection system adapted to at least assist in detecting substantial completion of reaction of the reactive gas with contamination on a surface of the system for generating an ion beam.

The end point detection system comprises an analysis system for the chemical makeup of gas that has been exposed to the surface during operation of the reactive gas cleaning system.

A temperature detector is arranged to detect substantial termination of an exothermic reaction of the reactive gas with contamination on a surface of the system.

The energizeable ionizing system includes a component within or in communication with the ionization chamber that is susceptible to harm by the reactive gas and means are provided to shield the component from reactive gas flowing through the system.

The means to shield the component comprises an arrangement for producing a flow of inert gas, such as argon, past the component.

The means for shielding a component comprises a shield member that is impermeable to the reactive gas.

The system is constructed to operate with reactive halogen gas as the reactive gas and the extraction electrode and associated parts comprise aluminum (Al) or alumina ($Al_2O_3$).

The ion source is constructed to produce ions within the ionization chamber via an arc-discharge, an RF field, a microwave field or an electron beam.

The system is associated with a vaporizer of condensable solid feed material for producing feed vapor to the ionization chamber.

The ion source is constructed to vaporize feed material capable of producing cluster or molecular ions, and the ionization system is constructed to ionize the material to form cluster or molecular ions for implantation.

The vacuum housing of the system is associated with a pumping system comprising a high vacuum pump capable of producing high vacuum and a backing pump capable of producing vacuum, the high vacuum pump operable during operation of the ion source, and being capable of being isolated from the vacuum housing during operation of the reactive cleaning system, the backing pump operable during operation of the reactive gas cleaning system.

The system is associated with an ion implantation apparatus, the apparatus constructed to transport ions following the extraction electrode implantation station within a vacuum chamber. In preferred embodiments an isolation valve is included for isolating the implantation station from the ionization chamber and the extraction electrode during operation of the reactive gas cleaning system.

The ion source is constructed and adapted to generate dopant ions for semiconductor processing, and the reactive gas cleaning system is adapted to deliver fluorine, F, or chlorine, Cl, ions to the ionization chamber or the extraction electrode for cleaning deposits from a surface.

The ion source is adapted to be temperature-controlled to a given temperature.

The ion source is adapted to generate a boron-containing ion beam; in preferred embodiments the boron-containing ion beam is generated by feeding vaporized borohydride material into the ion source, especially either decaborane, $B_{10}H_{14}$ or octadecaborane, $B_{18}H_{22}$.

The ion source is adapted to generate arsenic-containing ion beams.

The ion source is adapted to generate phosphorus-containing ion beams.

The ionization chamber of the ion source comprises aluminum.

The ionization chamber of the ion source or the extraction electrode comprises a material resistant to attack by halogen gases such as fluorine, F.

Another particular aspect of the invention is a method of in-situ cleaning using the system of any of the foregoing description, or of an ion source associated with an ion implanter, in which reactive halogen gas is flowed into an ion source while the ion source is de-energized and under vacuum.

Embodiments of this aspect have one or more of the following features.

The reactive halogen gas is fluorine, F.

The reactive halogen gas is chlorine, Cl.

The fluorine gas is introduced into the ion source from a remote plasma source.

The fluorine gas is produced in the remote plasma source by an $NF_3$ plasma.

The fluorine gas is produced in the remote plasma source by a $C_3F_8$ or $CF_4$ plasma.

The reactive halogen gas is $ClF_3$.

The cleaning procedure is conducted to remove deposits after the ion source has ionized decaborane, $B_{10}H_{14}$.

The cleaning procedure is conducted to remove deposits after the ion source has ionized octadecaborane, $B_{18}H_{22}$.

The cleaning procedure is conducted to remove deposits after the ion source has ionized arsenic-containing compounds, such as arsine, $AsH_3$, or elemental arsenic, As.

The cleaning procedure is conducted to remove deposits after the ion source has ionized phosphorus-containing compounds, such as elemental phosphorus, P, or phosphine, $PH_3$.

The cleaning procedure is conducted to remove deposits after the ion source has ionized antimony-containing compounds, such as trimethylantimony, $Sb(CH_4)_3$, or antimony pentaflouride, $SbF_5$.

The cleaning procedure is conducted for an ion source in situ in an ion implanter between changing ion source feed materials in order to implant a different ion species.

Another particular aspect of the invention is an ion implantation system having an ion source and an extraction electrode for extracting ions from the ion source, in which the extraction electrode includes a heater constructed to maintain the electrode at an elevated temperature sufficient to substantially reduce condensation on the electrode of gases or vapors being ionized and products produced therefrom.

Embodiments of this aspect have one or more of the following features.

The electrode comprises aluminum.

The electrode comprises of molybdenum.

The electrode is heated by radiative heaters.

The electrode is heated by resistive heaters).

The temperature of the electrode is controlled to a desired temperature; in embodiments the temperature is between 150C and 250C.

The electrode is periodically cleaned in situ by exposure to reactive halogen-containing gas.

Another aspect of the invention is a method of in-situ cleaning of an ion extraction electrode of any of the systems described or an ion extraction electrode which is associated with an ion implanter, in which reactive halogen gas is flowed over the ion extraction electrode while the electrode is in situ and under vacuum.

Embodiments of this aspect have one ore more of the following features.

The reactive halogen gas is fluorine, F or chlorine, Cl.

Fluorine gas is introduced from a remote plasma source into a vacuum housing in which the extraction electrode resides.

Fluorine gas is produced in the remote plasma source by a $NF_3$ plasma.

Fluorine gas is produced in the remote plasma source by a $C_3F_8$ or $CF_4$ plasma.

The reactive gas is $ClF_3$.

The cleaning procedure is conducted to remove deposits after the ion source has ionized decaborane, $B_{10}H_{14}$. The cleaning procedure is conducted to remove deposits after the ion source has ionized octadecaborane, $B_{18}H_{22}$.

The cleaning procedure is conducted to remove deposits after the ion source has ionized arsenic-containing compounds, such as arsine, $AsH_3$, or elemental arsenic, As.

The cleaning procedure is conducted to remove deposits after the ion source has ionized phosphorus-containing compounds, such as elemental phosphorus, P, or phosphine, $PH_3$.

The cleaning procedure is conducted between changing ion source feed materials in order to implant a different ion species.

Ion Source Provided with In-situ Etch Cleaning

According to a preferred embodiment, the in situ chemical cleaning process utilizes atomic F gas, to effectively clean deposits from the ion source and from the ion extraction electrode, while the ion source and extraction electrode remain installed in the ion beam-producing system. In a preferred embodiment an electron impact ion source with cooled chamber walls is employed. Preferably, the ionization chamber and source block are fabricated of aluminum or of an aluminum containing complex, enabling aluminum fluoride to be created on the aluminum surfaces to act as a passivating layer, that prevents further chemical attack by F.

One embodiment of this feature uses the outlet of a remote reactive gas source directly coupled to an inlet to the ion source.

In a preferred embodiment the reactive gas source is a plasma source which introduces an etch feed gas, such as $NF_3$ or $C_3F_8$, into a supplemental ionization chamber. By sustaining a plasma in the supplemental chamber, reactive gases such as F and $F_2$ are produced, and these reactive gases, introduced to the main ion source, chemically attack the deposited materials. By-products released in the gas phase are drawn through the extraction aperture of the ionization chamber and are pumped away by the vacuum system of the installation, cleaning the chamber.

Deposition Model

It is a generally observed principle of physics that when two objects interact, there can be more than one outcome. Furthermore, one can assign probabilities or likelihoods to each outcome such that, when all possible outcomes are considered, the sum of their individual probabilities is 100%. In atomic and molecular physics such possible outcomes are sometimes called "channels" and the probability associated with each interaction channel is called a "cross section". More precisely, the likelihood of two particles (say, an electron and a gas molecule) interacting with each other at all is the "total cross section", while the likelihoods of certain types of interactions (such as the interaction represented by the electron attaching itself to the gas molecule thus forming a negative ion, or by removing an electron from the gas molecule thus forming a positive ion, or by dissociating the molecule into fragments, or by elastically scattering from the molecule with no chemical change of the molecule) are the "partial cross sections".

This state of affairs can be represented by a mathematical relation which expresses the total cross section $\sigma_T$ as the sum of its i partial cross sections:

$$\sigma_T = \sigma_1 + \sigma_2 + \sigma_3 + \ldots \sigma_i, \text{ or} \tag{1}$$

$$\sigma_T = \Sigma \sigma_i. \tag{2}$$

The ion sources used in ion implanters typically display modest ionization fractions. That is, only a small fraction (from a few percent to a few tens of percent) of the gas or vapor fed into the ion source is ionized. The rest of the gas or vapor typically leaves the source in the gas phase, either in its original state or in some other neutral state. That is, the ionization cross section is much smaller than the total cross section. Of course, some of the gas components can stay in the ion source as deposited materials, although this tends to be a small percentage of the total for the commonly used implantation feed materials. While feed materials vaporized by heating such as elemental As or P more readily produce deposits than do normally gaseous feed materials, the heated vapor tends to stay in the gas phase if the walls of the ion source are at a higher temperature than the vaporizer, and do not pose a severe deposition risk. However, significant detrimental deposits may still be produced when producing boron beams from gaseous BF3 feed gas, for example, as well as beam from In and Sb.

Also, in general, over time, deposits of condensable materials do occur on certain other components of ion producing systems, affecting their operational life before disassembly and cleaning.

Furthermore, in the case of the borohydrides, the total cross section representing all interactions with the ionizing medium (i.e., electrons in the ion source) appears large, the ionization cross section is small, and by far the largest cross section represents the channel for dissociation of the borohydride molecules into non-volatile fragments, which then remain on surfaces in the ion source. The problem of deposition of these fragments is adversely influenced by cooling of the ionization chamber walls in an effort to reduce thermal decomposition of the feed material. In sum, it appears that deposition from borohydrides of boron-containing fragments in the source is a fundamental phenomenon which would be observed in any type of ion source acting on this material, and solution to the problem is of broad, critical interest to the semiconductor manufacturing industry.

Electron Impact Ion Source Suitable for Borohydrides

An ion source particularly suitable for borohydrides is an electron-impact ion source which is fully temperature-controlled (see U.S. Pat. Nos. 6,452,338 and 6,686,595; also International Application no. PCT/U.S.03/20197, each herein incorporated by reference); also see FIG. 7. Instead of striking an arc-discharge plasma to create ions, the ion source uses a "soft" electron-impact ionization of the process gas by energetic electrons injected in the form of one or more focused electron beams. This "soft" ionization process preserves these large molecules so that ionized clusters are formed. As seen in FIG. 7, solid borohydride material is heated in a vaporizer and the vapor flows through a vapor conduit to a metal chamber, i.e., the ionization chamber. An electron gun located external to the ionization chamber delivers a high-current stream of energetic electrons into the ionization chamber; this electron stream is directed roughly parallel and adjacent to an extended slot in the front of the chamber. Ions are extracted from this slot by an ion extraction electrode, forming an energetic ion beam. During transport of the sublimated borohydride vapor to the ionization chamber all surfaces are held at a higher temperature than that of the vaporizer (but well below the temperature of dissociation), to prevent condensation of the vapor. Many hours of testing have confirmed that the surfaces of the vapor feed and valves indeed remain clean when such temperature control is implemented.

Extension of Ion Source Lifetime with Decaborane Between Cleanings

The impact of vapor flow rate on source lifetime (maintenance interval) was studied in a quantitative manner. The electron impact ion source was run continuously with decaborane feed material under controlled conditions at a given vapor flow, until it was determined that the buildup of material was causing a significant decrease in decaborane beam current. Five different flow rates were tested, ranging from about 0.40 sccm to 1.2 sccm. This resulted in mass-analyzed decaborane beam currents ($B_{10}H_x^+$) ranging from about 150 μA to 700 μA. It is noted that typical feed gas flows in ion sources used in ion implantation range from 1 to about 3 sccm, so this test range is considered a "low" flow regime.

The results of these lifetime tests are summarized in FIG. 5. It suggests a simple model, a hyperbolic function. This is not unexpected; if one assumes zero vapor flow, then the source lifetime would, in principle, diverge; and if one assumes very high vapor flow, then source lifetime would decrease asymptotically to zero. Thus, the model can be expressed by:

$$(\text{flow rate}) \times (\text{flow duration}) = \text{constant}. \tag{3}$$

Equation (3) simply states that lifetime (i.e., flow duration) is inversely proportional to flow rate; the constant is the amount of deposited material. If equation (3) is accurate, then the fraction of deposited material is independent of the rate of flow of material, which is consistent with our model describing a fixed cross section for dissociation and subsequent deposition. These data show that, using the electron impact ion source with about 0.5 sccm decaborane vapor flow, dedicated decaborane operation can be sustained for more than 100 hours. While this is acceptable in many cases, in commercial semiconductor fabrication facilities, source lifetimes of well over 200 hours are desired. When the ion source is used in conjunction with the novel in-situ cleaning procedure of the present invention, greatly extended source lifetimes are achieved.

Advantages of Certain Features of In-situ Ion Source Chemical Cleaning

There are several very important advantages to using a supplemental ion source to produce the reactive gas for in situ cleaning of the ion source. Such plasma sources have been developed for effluent removal applications from process exhaust systems (such as the Litmus 1501 offered by Advanced Energy, Inc.), and for cleaning large CVD process chambers (such as the MKS Astron reactive gas generator), but to the inventors' knowledge it has not been previously recognized that a remote reactive gas generator could be usefully applied to cleaning the ionization chamber of an ion source and the extraction electrode used to generate an ion beam. Remote reactive gas generators such as the MKS Astron have been used to clean process chambers (i.e., relatively large vacuum chambers wherein semiconductor wafers are processed), an application which uses high flows of feed gas (several Standard Liters per Minute (SLM)), and high RF power applied to the plasma source (about 6 kW). The system of the present invention can employ a much more modest feed gas rate, e.g. less than about 0.5 SLM of NF$_3$, and much less RF power (less than about 2.5 kW), for the very small volume of the ionization chamber of the ion source being cleaned (the volume of the ionization chamber for an implanter of semiconductor wafers is typically less than about 100 ml, e.g. only about 75 ml, with a surface area of less than about 200 cm$^2$, e.g. about 100 cm$^2$). The reactive gas flow into the ionization chamber is less than about 2 Standard Liters Per Minute.

One might think it strange to use an external ion source to generate plasma by-products to introduce into the main ion source of the system; why not just introduce the (e.g., NF$_3$) gas directly into the main ion source to create the plasma by-products within that source directly? The reasons seem not obvious. In order to achieve etch rates which far exceed deposition rates from the feed gas during a small fraction of the uptime (productive period) of the ion implantation system, it is found that the reactive gas must be produced and introduced at relatively very high flows into the small ionization chamber, e.g., flows on the order of 10$^2$ to 10$^3$ sccm, compared to typical feed flow rates for the main ion source for ion implantation in the range of 1-3 sccm; such high flows would raise the pressure within the ionization chamber of the main ion source far beyond that for which it is designed to operate for ion implantation. Furthermore, sustaining a high-density NF$_3$ plasma within the main ion source would etch away sensitive components, such as hot tungsten filaments. This is because halogen gases etch refractory metals at a high rate which increases exponentially with temperature. (For example, Rosner et al. propose a model for F etching of a tungsten substrate:

$$\text{Rate(microns/min)} = 2.92 \times 10^{-14} T^{1/2} N_F e^{-3900/T}, \quad (4)$$

Where $N_F$ is the concentration of fluorine in atoms per cm$^3$, and T is the substrate temperature in degrees Kelvin.)

Since virtually all ion sources for ion implantation incorporate hot filaments, and since in many cases the ion source chambers are also made of refractory metals such as Mo and W, or graphite (which is aggressively attacked by F), these ion sources would quickly fail under high temperature operating conditions, making the etch cleaning process unusable.

In the presently preferred embodiment, atomic fluorine is caused to enter the cold ionization chamber of the de-energized main ion source at a flow rate of 100 sccm or more, and the total gas flow into the ionization chamber is 500 sccm or more. Under these conditions, the gas pressure within the ionization chamber is about 0.5 Torr, while the pressure within the vacuum source housing of the implanter is a few tens of milliTorr or more. In a preferred mode of operation, preceding the cleaning phase, an isolation valve is closed between the vacuum housing of the ion source and the implanter vacuum system, and the turbo-molecular pump of the ion source is isolated. The housing of the ion source is then pumped with high-capacity roughing pumps of the vacuum system (i.e., the pumps which normally back the turbomolecular pumps and evacuate the vacuum system down to a "rough" vacuum).

A different embodiment of a related etch clean process, shown in FIG. 5, utilizes a "dry etch" gas such as ClF$_3$. As has previously been observed, the ClF$_3$ molecule breaks up on contact with deposited surfaces to be cleaned; thus, atomic fluorine and chlorine are released without requiring the generation of a plasma. While handling of ClF$_3$ gas requires special equipment due to its highly reactive nature, it in principle can simplify the chemical cleaning process to the extent of not requiring an ancillary reactive gas plasma source. Since toxic gases are routinely fed into an ion source for an ion implanter, much of the equipment is already constructed to be "toxic-gas-friendly", and a separate gas distribution system incorporating ClF$_3$ can be added in a straightforward manner.

Advantages of the in-situ chemical cleaning of the ion source for an ion implanter include: a) extending source life to hundreds, or possibly thousands, of hours before service is required; b) reducing or eliminating cross-contamination brought about by a species change, for example, when switching from octadecaborane ion implantation to arsenic or phosphorus ion implantation, and from arsenic or phosphorus ion implantation to octadecaborane ion implantation; and c) sustaining peak ion source performance during the service life of the ion source. For example, performing a 10 minute chemical cleaning protocol every eight hours (i.e., once every shift change of operating personnel) and between each species change would have a minimal impact on the uptime of the implanter, and would be acceptable to a modern semiconductor fabrication facility.

Endpoint Detection

It is realized to be beneficial to provide endpoint detection during the cleaning process, so that quantitative information on the efficacy and required duration of the cleaning process may be generated, and the reproducibility of the chemical cleaning process may be assured. FIG. 3 shows a differentially-pumped quadrupole mass analyzer sampling the cleaning process. By monitoring the concentrations of cleaning gas products such as F, Cl, BF$_3$, PF$_3$, AsF$_3$, AlF$_3$, WF$_6$, for example, the cleaning process may be tuned and verified. Alternatively, optical means of monitoring the process may be utilized. An FTIR optical spectrometer can monitor the gases resident in the vacuum housing of the ion source of the implanter, through a viewport. This non-invasive (ex-situ) means to identify chemical species may be preferable to in-situ monitoring devices in certain cases. Alternatively, see FIG. 4, an extractive FTIR spectrometer may be coupled to the source vacuum housing for endpoint monitoring. A novel means to accomplish endpoint detection consists of monitoring the temperature of the ionization chamber during cleaning. Since the chemical reaction is exothermic, energy is released during the reaction, elevating the chamber temperature. This effect can in principle be used to establish when the reaction rate is diminished.

Novel Ion Extraction Electrode

Borohydrides such as decaborane and octadecaborane are thermally sensitive materials. They vaporize and condense at temperatures between 20C and 100C. It is therefore important to maintain all surfaces with which these materials come into contact at a temperature higher than the vaporizer temperature (but below the temperature at which they dissociate), to prevent condensation. We have found that contamination of the extraction electrode is a problem when using such a borohydride. Both direct ion beam strike and condensed feed vapor or products of its molecular disassociation can degrade operation of the ion beam formation optics, since these boron-containing layers appear to be electrically insulating. Once electrically insulating layers are deposited, they acquire an electrical charge ("charge up") and create vacuum discharges, or "glitches", upon electrical breakdown. Such a discharge creates instabilities in the ion beam current and can contribute to the creation of particles that may reach a process chamber to which the ion beam is directed. An ion implanter which has an ion beam-producing system that experiences many glitches per hour is not considered production-worthy in modern semiconductor fabrication facilities. Furthermore, even in absence of such discharges, as insulating coatings become thicker, the electric charge on electrode surfaces create unwanted stray electric fields which can result in beam steering effects, creating beam loss and may adversely affect ion beam quality.

Discovery of new information has led to a robust solution to this problem. Most implanter ion extraction electrodes are made of graphite. Graphite has been seen to have many advantages in this application, including low materials cost, ease of machining, high electrical conductivity, low coefficient of thermal expansion, and good mechanical stability at high temperatures. However, using a graphite extraction electrode, instabilities were observed after producing an ion beam of borohydrides. It was suspected that the surfaces of the electrode had become insulating. Samples of the electrode deposits were collected and a chemical analysis performed by x-ray fluorescence spectroscopy. The study revealed a chemical stoichiometry consistent with a boron-carbon compound of the form $B_2C$, which was found to be insulating. In addition, it appeared that metal surfaces in the vicinity of the ion source, including the front plate (i.e., the ion extraction aperture plate) of the ion source also had deposited insulating coatings after long use. It was conceived to fabricate the electrode of aluminum, and provide radiant heaters to keep the electrode plates, i.e., the suppression and ground electrodes, at a well-controlled, elevated temperature (see FIGS. 9, 11) sufficiently high to prevent condensation of decaborane and octadecaborane. In addition, the suppression electrode, which faces the ion source, was fabricated of a single machined piece of aluminum, with a smooth, featureless aspect and all fasteners were located at the backside of the plates. This configuration dramatically reduced the number and severity of discharge points in the event that insulating coatings were formed, employing the principle that the electric field stress at a "point", or sharp feature, is many times greater than at a smooth surface.

The extraction electrode, thus produced, demonstrated excellent performance, and operated reliably for more than 100 hours (at least ten times as long as the graphite electrode) with very low glitch frequency. This great improvement is attributed to: i) Al construction (i.e., metal versus graphite), ii) Active heating and temperature control of the electrode plates, and iii) smooth electrode surfaces. It was found that operating the electrode plates at 200C gave good results when running decaborane, significantly reducing the amount of deposited material. In general, the temperature of the extraction electrode should be kept below the dissociation temperature of the feed material. In the case of decaborane the temperature should be kept below 350C, preferably in the range 150C to 250C For octadecaborane operation, the temperature should not exceed 160C, since chemical changes occur in octadecaborane above this temperature; when running octadecaborane, an extraction electrode temperature between 120C and 150C yields good results.

The radiative design shown in FIG. 11 demonstrated very good temperature uniformity. Incorporating resistive heaters, particularly using an aluminum electrode as illustrated in FIG. 12, can also yield good uniformity and results in a more compact design requiring less maintenance.

For constructing a heated extraction electrode, other metals would also work, for example molybdenum. Molybdenum has the advantage of being refractory, so it can withstand very high temperatures. It also has good thermal conductivity. Aluminum, on the other hand, is a column III element like In and B of the periodic table, and therefore offers the advantage of being only a mild contaminant in silicon (it is a P-type dopant in silicon), while transition metals such as molybdenum are very detrimental to carrier lifetimes in integrated circuits. Aluminum is also not readily attacked by halogens, whereas transition metals such as molybdenum are susceptible to attack, particularly at elevated temperatures. The primary disadvantage of aluminum, however, is that it is not a high temperature material, and should be used below about 400 C.

For these reasons, depending upon the particular use, the heated electrode is constructed of a selected heat-resistant material, aluminum or an aluminum containing complex often being preferred when used in association with in situ etch cleaning.

DETAILED DESCRIPTION

Novel Ion Beam-Generating System

Figure 1:
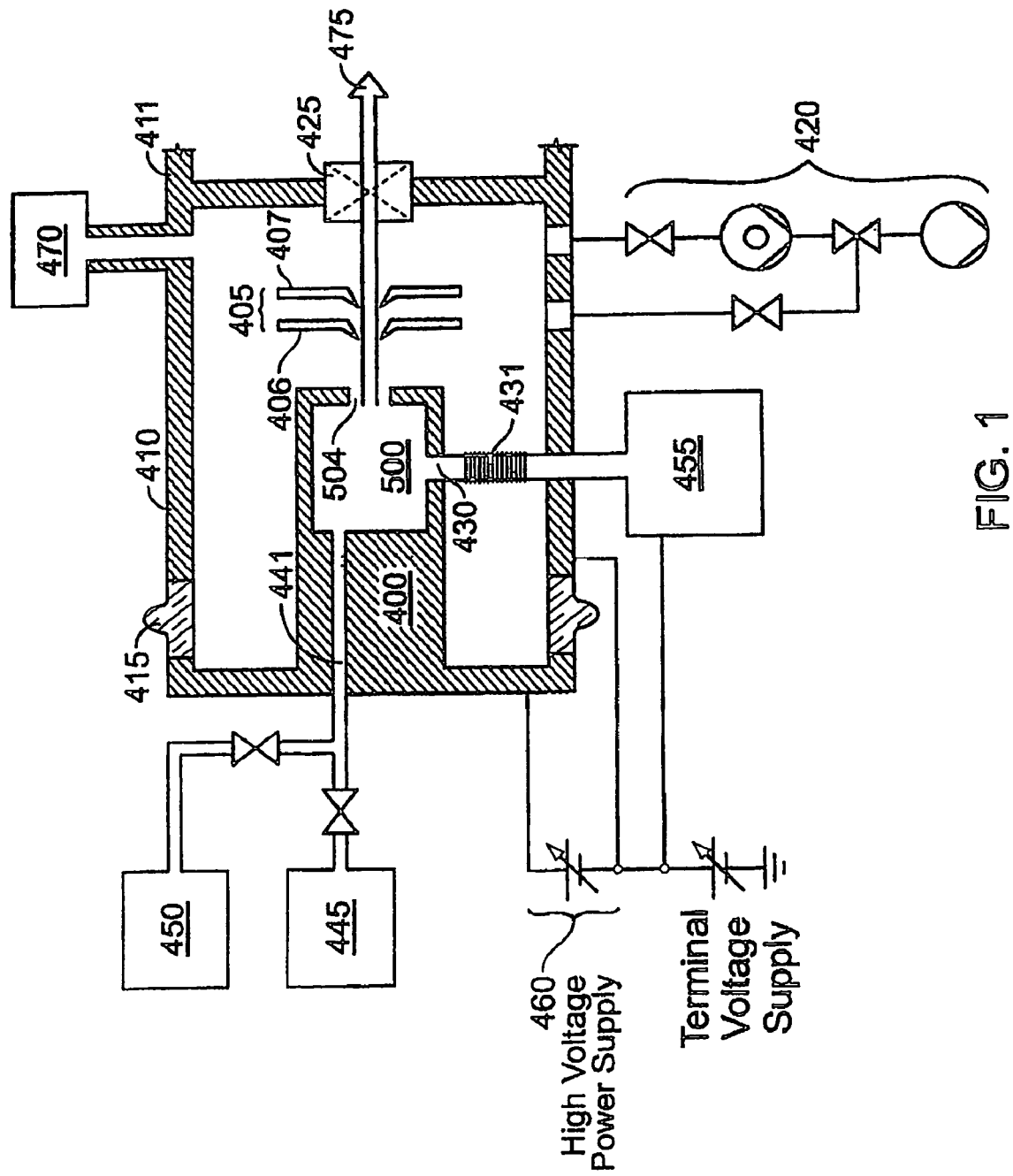
FIG. 1: Ion beam generation system incorporating reactive gas cleaning.

FIG. 1 shows an ion beam-generating system. As shown in this example, it is adapted to produce an ion beam for transport to an ion implantation chamber for implant into semiconductor wafers or flat-panel displays. Shown are ion source 400, extraction electrode 405, vacuum housing 410, voltage isolation bushing 415 of electrically insulative material, vacuum pumping system 420, vacuum housing isolation valve 425, reactive gas inlet 430, feed gas and vapor inlet 441, vapor source 445, feed gas source 450, reactive gas source 455, ion source high voltage power supply 460, and resultant ion beam 475. An ion beam transport housing is indicated at 411. The ion source 400 is constructed to provide cluster ions and molecular ions, for example the borohydride ions $B_{10}H_x^+$, $B_{10}H_x^-$, $B_{18}H_x^+$, and $B_{18}H_x^-$ or, or in addition, more conventional ion beams such as $P^+$, $As^+$, $B^+$, $In^+$, $Sb^+$, $Si^+$, and $Ge^+$. Ion source 400 may be a Bernas-style arc-discharge ion source, which is most commonly used for ion implantation, or a "bucket"-type water-cooled ion source which uses an immersed RF (radio frequency) antenna forming an RF field to create ions, a microwave ion source, or an electron-impact ionization source, for example. The gas and vapor inlet 441 for gaseous state feed material to be ionized is connected to a suitable vapor source 445, which may be in close proximity to gas and vapor inlet 441 or may be located in a more remote location, such as in a gas distribution box located elsewhere within a terminal enclosure. A terminal enclosure is a metal box, not shown, which encloses the ion beam generating system. It contains required facilities for the ion source such as pumping systems, power distribution, gas distribution, and controls. When mass analysis is employed for selection of an ion species in the beam, the mass analyzing system may also be located in the terminal enclosure.

In order to extract ions of a well-defined energy, the ion source 400 is held at a high positive voltage (in the more common case where a positively-charged ion beam is generated), with respect to the extraction electrode 405 and vacuum housing 410, by high voltage power supply 460. The extraction electrode 405 is disposed close to and aligned with the extraction aperture 504 of the ionization chamber. It consists of at least two aperture-containing electrode plates, a so-called suppression electrode 406 closest to ionization chamber 500, and a "ground" electrode 407. The suppression electrode 406 is biased negative with respect to ground electrode 407 to reject or suppress unwanted electrons which are attracted to the positively-biased ion source 400 when generating positively-charged ion beams. The ground electrode 407, vacuum housing 410, and terminal enclosure (not shown) are all at the so-called terminal potential, which is at earth ground unless it is desirable to float the entire terminal above ground, as is the case for certain implantation systems, for example for medium-current ion implanters. The extraction electrode 405 may be of the novel temperature-controlled metallic design, described below.

(If a negatively charged ion beam is generated the ion source is held at an elevated negative voltage with other suitable changes, the terminal enclosure typically remaining at ground.)

FIG. 1 shows the reactive gas source 455 at terminal potential, with reactive gas inlet 430 incorporating a high voltage break 431, which can be fabricated of an insulating ceramic such as $Al_2O_3$, for example. Since ion sources for ion implantation can in general be biased up to a maximum voltage of about 90 kV, this high voltage break 431 must stand off 90 kV for that application. As will be described below, the cleaning system is used only with the ionizing source and high voltages off (de-energized), so that there is only high voltage across break 431 when the vacuum housing 410 is under high vacuum, which makes high voltage standoff clearance requirements easier to meet. A dedicated endpoint detector 470, in communication with the vacuum housing 410, is used to monitor the reactive gas products during chemical cleaning.

For ion sources suitable for use with ion implantation systems, e.g. for doping semiconductor wafers, the ionization chamber is small, having a volume less than about 100 ml, has an internal surface area of less than about 200 $cm^2$, and is constructed to receive a flow of the reactive gas, e.g. atomic fluorine or a reactive fluorine-containing compound at a flow rate of less than about 200 Standard Liters Per Minute.

It is seen that the system of FIG. 1 enables in situ cleaning, i.e. without the ion source being removed from its operating position in. the vacuum housing, and with little interruption of service.

Figure 2:
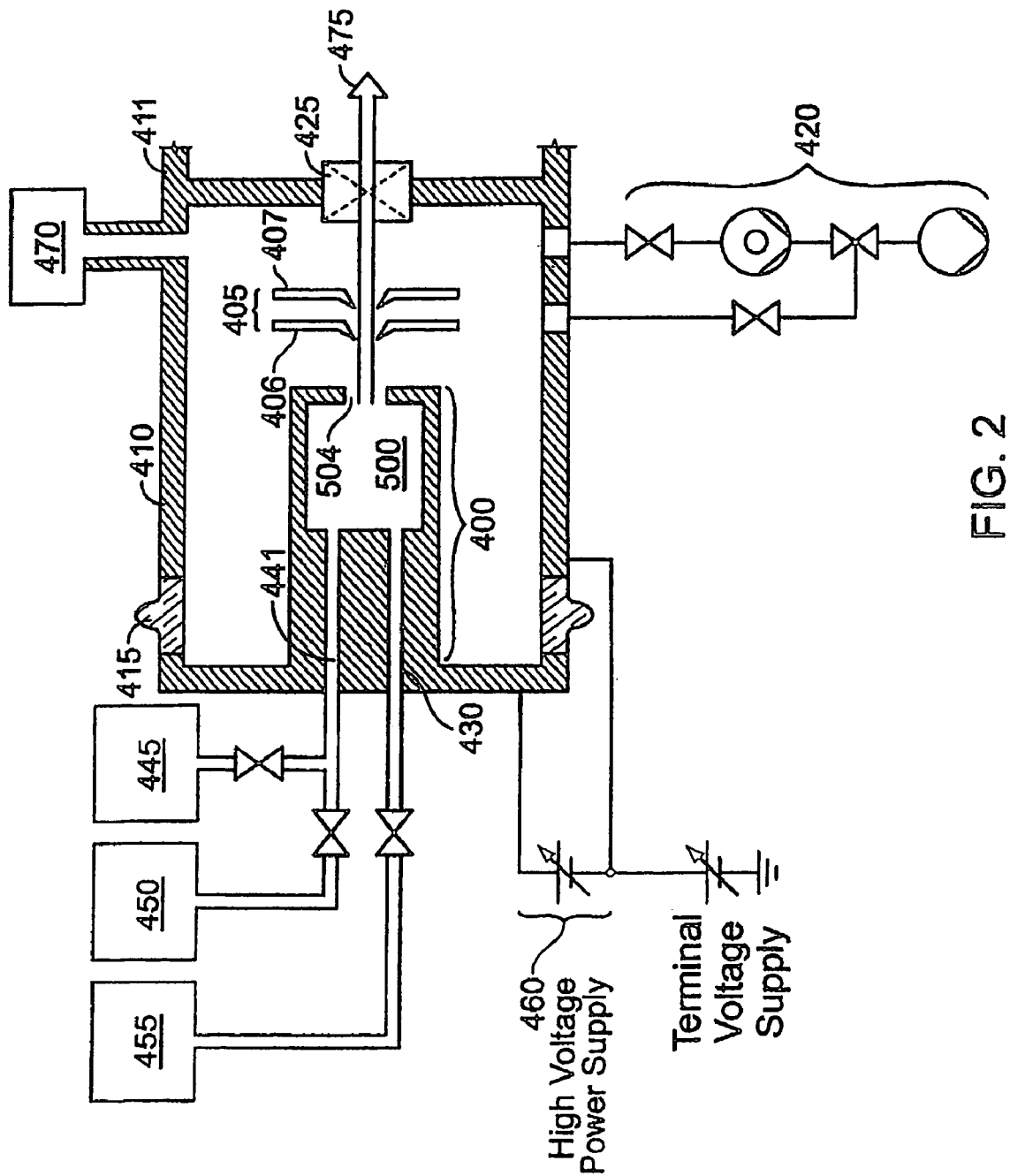
FIG. 2: Second embodiment of ion beam generation system incorporating reactive gas cleaning.

FIG. 2 illustrates another embodiment The principal difference in FIG. 2 over FIG. 1 is that the reactive gas source 455 and reactive gas inlet 430 are at ion source potential. The benefits of this approach are twofold: it is a more compact arrangement, and it allows the reactive gas source 455 and its associated gas supplies to be contained in the gas box which, at ion source potential supplies gas and power to the ion source 400, as is typical in commercial ion implantation systems.

Chemical Cleaning System

Figure 3:
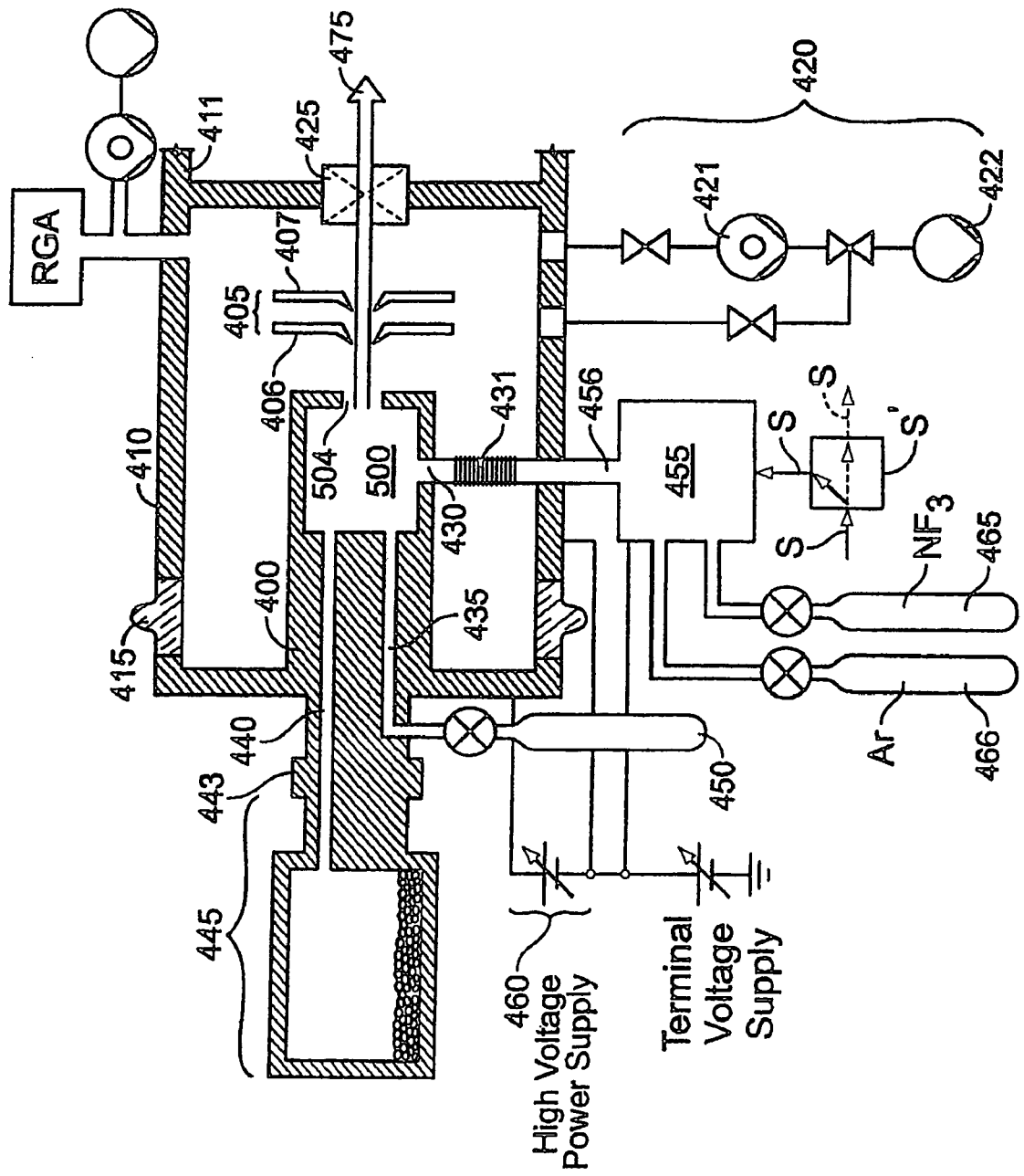
FIG. 3: Ion beam generation system similar to FIG. 1 but incorporating a vaporizer and certain gas distribution elements.

The embodiment of FIG. 3, having many features similar to FIG. 1, is constructed to generate, selectively, both cluster ions and monomer ions. It has a dedicated gas inlet 435 for feed material in normally gaseous state and is in communication, through valve 443, with a vapor source 445 for producing borohydride and other vaporized feed materials. For conducting in-situ chemical cleaning of the ion source and electrode, a remote plasma source 455 disassociates gas supplied by a cleaning gas supply 465, for example $NF_3$, into decomposition products such as F, $F_2$, and N-containing compounds. When cleaning is desired, after de-energizing the ion source, the decomposition products are fed into the ionization chamber from the outlet 456 of the remote plasma source 455 by dedicated reactive gas inlet 430. The remote plasma source 455 is mounted on the terminal potential side of voltage isolation bushing 415. Since the ion source 400 runs at high voltage, a high voltage break 431 in vacuum provides voltage isolation.

To initiate a cleaning cycle, the ion source is shut down and vacuum housing isolation valve 425 is closed; the high vacuum pump 421 of the vacuum pumping system 420 is isolated and the vacuum housing 410 is put into a rough vacuum state of <1 Torr by the introduction of dry $N_2$ gas while the housing is actively pumped by backing pump 422. Once under rough vacuum, argon gas (from Ar gas source 466) is introduced into the plasma source 455 and the plasma source is energized by on-board circuitry which couples radio-frequency (RF) power into the plasma source 455. Once a plasma discharge is initiated, Ar flow is reduced and the F-containing cleaning gas feed 465, e.g. $NF_3$, is introduced into plasma source 455. Reactive F gas, in neutral form, and other by-products of disassociated cleaning gas feed 465, are introduced through reactive gas inlet 430 into the de-energized ionization chamber 500 of ion source 400. The flow rates of Ar and $NF_3$ (for example) are high, between 0.1 SLM (Standard Liters per Minute) and a few SLM. Thus, up to about 1 SLM of reactive F as a dissociation product can be introduced into the ion source 400 in this way. Because of the small volume and surface area of ionization chamber 500, this results in very high etch rates for deposited materials. The ionization chamber 500 has a front plate facing the extraction electrode, containing the extraction aperture 504 of cross sectional area between about 0.2 $cm^2$ and 2 $cm^2$, through which, during energized operation, ions are extracted by extraction electrode 405. During cleaning, the reactive gas load is drawn from ionization chamber 500 through the aperture 504 by vacuum of housing 410; from housing 410 the gas load is pumped by roughing pump 422. Since the extraction electrode 405 is near and faces aperture 504 of ionization chamber 500, the electrode surfaces intercept a considerable volume of the reactive gas flow. This results in an electrode cleaning action, removing deposits from the electrode surfaces, especially from the front surface of suppression electrode 406, which is in position to have received the largest deposits. Thus, it is beneficial to fabricate extraction electrode and its mounting of F-resistant materials, such as Al and $Al_2O_3$.

The embodiment of FIG. 3 also has an endpoint detector consisting of a differentially-pumped, Residual Gas Analyzer (RGA), constructed for corrosive service. Analyzer RGA is in communication with vacuum housing 410. It is to be used as a detector for the end point of the cleaning action by monitoring partial pressures of F-containing reaction products (for example, $BF_3$ gas resulting from B combining with F). Other types of endpoint detectors can be used, the RGA being shown to illustrate one particular embodiment. When the boron-containing partial pressures decline at RGA, the cleaning process is largely completed. Once the cleaning process is ended, the plasma source 455 is turned off and is briefly purged with Ar gas (which also purges the ionization chamber 500, the housing 410 and elements contained therein). The roughing pump 422 is then isolated from direct communication with vacuum housing 410, the high vacuum pump 421 isolation valve is opened, and vacuum housing 410 is restored to high vacuum (about $1\times10^{-5}$ Torr or below). Then, vacuum housing isolation valve 425 is opened. The system is now ready to resume ion beam generation. The ion source voltage supply 460 can be energized and ion source 400 operated normally.

Figure 16:
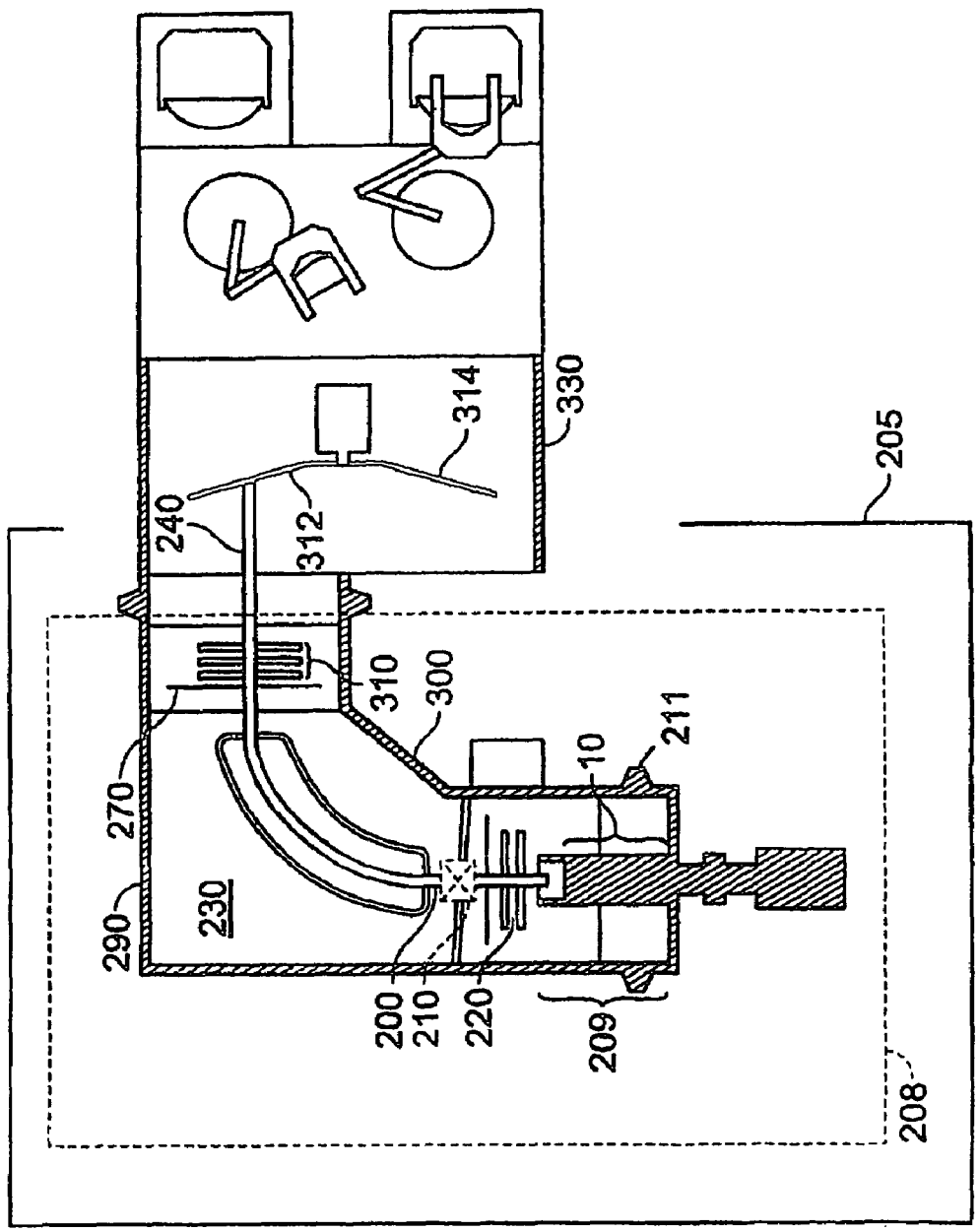
FIG. 16: Ion implanter.

An advantage of the embodiment of FIG. 3 is that the service facilities needed to support the remote plasma source 455, such as cooling water circulation and electrical power, can be at the terminal potential of an ion implanter (see 208 in FIG. 16). This enables sharing facilities denoted at S such as cooling water and electrical power, with the mass-analyzer magnet 230 of the implanter. During cleaning mode, when plasma source 455 is energized, the analyzer 230 is de-energized and therefore does not need water or power, and vise versa, during ion beam production mode. This "sharing" can be accomplished by suitable control arrangements represented diagrammatically at S', which direct service facilities such as cooling water circulation and power supply connection alternatively to the analyzer magnet 230, dashed arrow S, or to the remote plasma source 455, solid arrow S, depending upon the mode of operation being employed.

Figure 4:
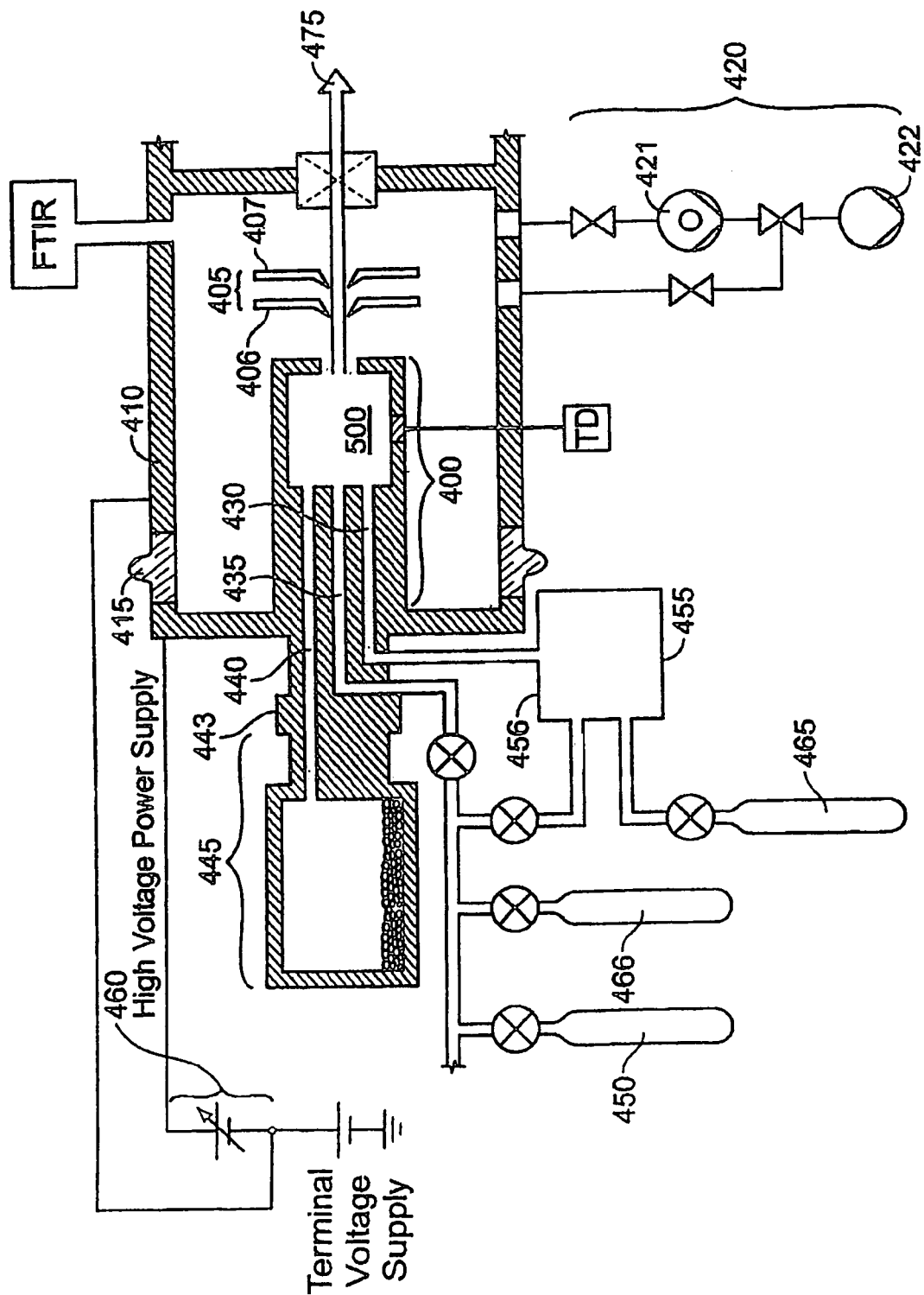
FIG. 4: Ion beam generation system similar to FIG. 2 but incorporating a vaporizer and certain gas distribution elements.

FIG. 4 shows an implementation similar to FIG. 2 for conducting in-situ chemical cleaning of an source 400 and extraction electrode 405. Three inlet passages are integrated into ion source 400, respectively for reactive gas 430 from plasma source 455, feed gas 435 from one of a number of storage volumes 450 selected, and feed vapor 440 from vaporizer 445. Unlike FIG. 3, the embodiment of FIG. 4 has the plasma-based reactive gas source 455 at the high voltage of ion source 400. This enables the remote plasma source 455 to share control points of the ion source 400, and also enables the cleaning feed gas 465 and argon purge gas from storage 466 to be supplied from the ion source gas distribution box, which is at source potential, see also FIGS. 6 and 6A. Also shown is a different type of endpoint detector, namely a Fourier Transform Infrared (FTIR) optical spectrometer. This detector can function ex-situ (outside of the vacuum housing), through a quartz window. Instead, as shown in FIG. 4, an extractive type of FTIR spectrometer may be used, which directly samples the gas in the vacuum housing 410 during cleaning. Also a temperature sensor TD may sense the temperature of the de-energized ionization chamber by sensing a thermally isolated, representative region of the surface of the chamber. The sensor ID can monitor heat produced by the exothermic reaction of F with the contaminating deposit, to serve as an end-point detection.

Figure 5:
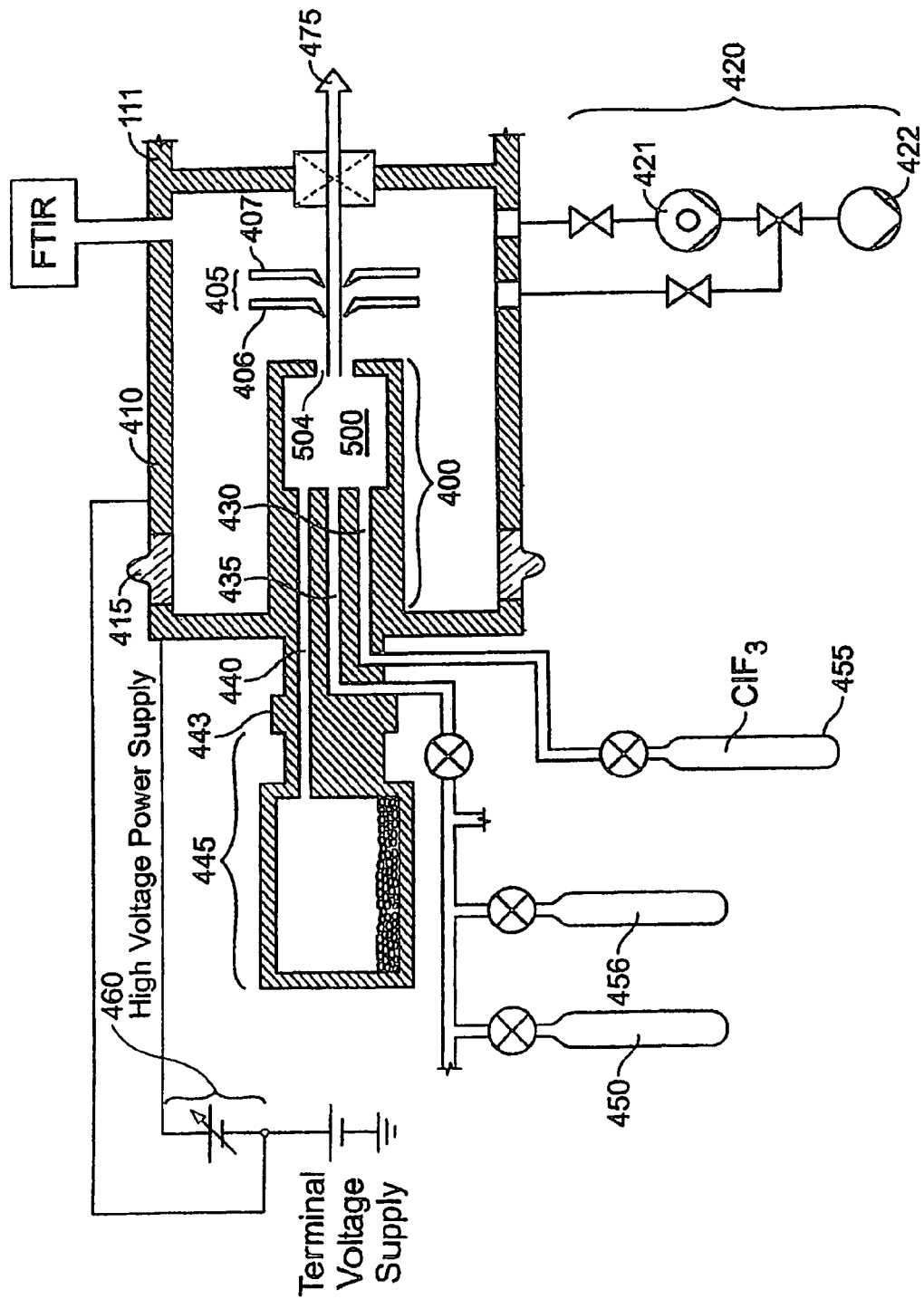
FIG. 5: Ion generation system incorporating reactive gas cleaning by the introduction of $ClF_3$.

FIG. 5 shows an ion beam-generating system similar to that of FIG. 4, but incorporating a fundamentally different type of reactive gas source 455. In this case, reactive $ClF_3$ gas contained in a gas cylinder is fed directly into ion source 400 without use of a remote plasma source. This potentially reduces equipment cost and footprint since power and controls for a remote plasma source are not required. However, since $ClF_3$ is pyrophoric, it is dangerous and requires special gas handling, whereas $NF_3$ (for example) is primarily an asphyxiant, and is less toxic than many semiconductor gases, such as $BF_3$, $PH_3$, or $AsH_3$, and therefore safer.

Figure 6:
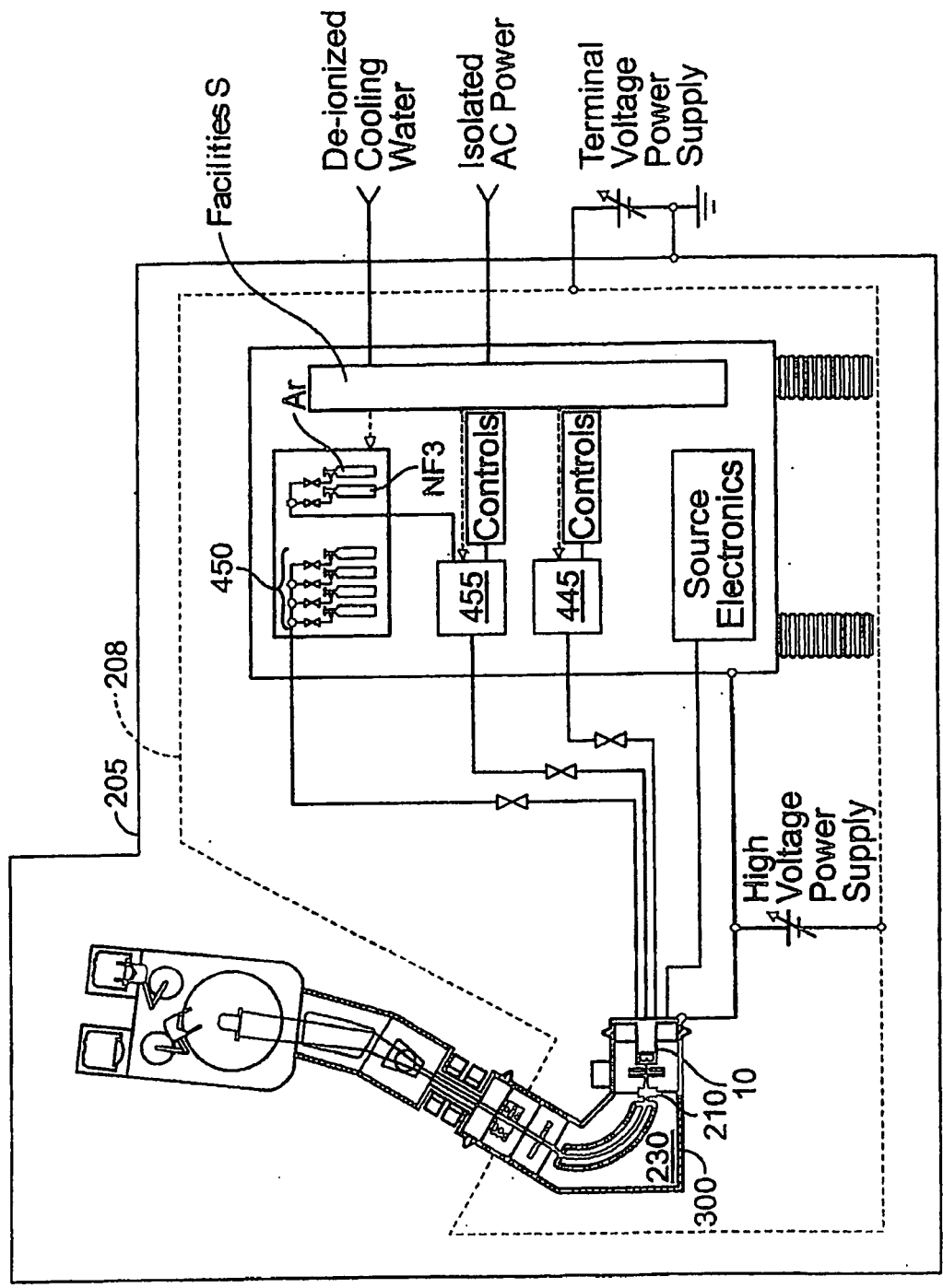
FIG. 6: Gas box for an ion implanter which includes a reactive gas plasma source, feed vapor source, ion source electronics, and facilities for the plasma source.

FIG. 6 shows plasma source 455, vapor source 445, source electronics, and service facilities S for the plasma source contained within a gas box B meant for retrofit into an existing ion implanter installation.

Figure 6A:
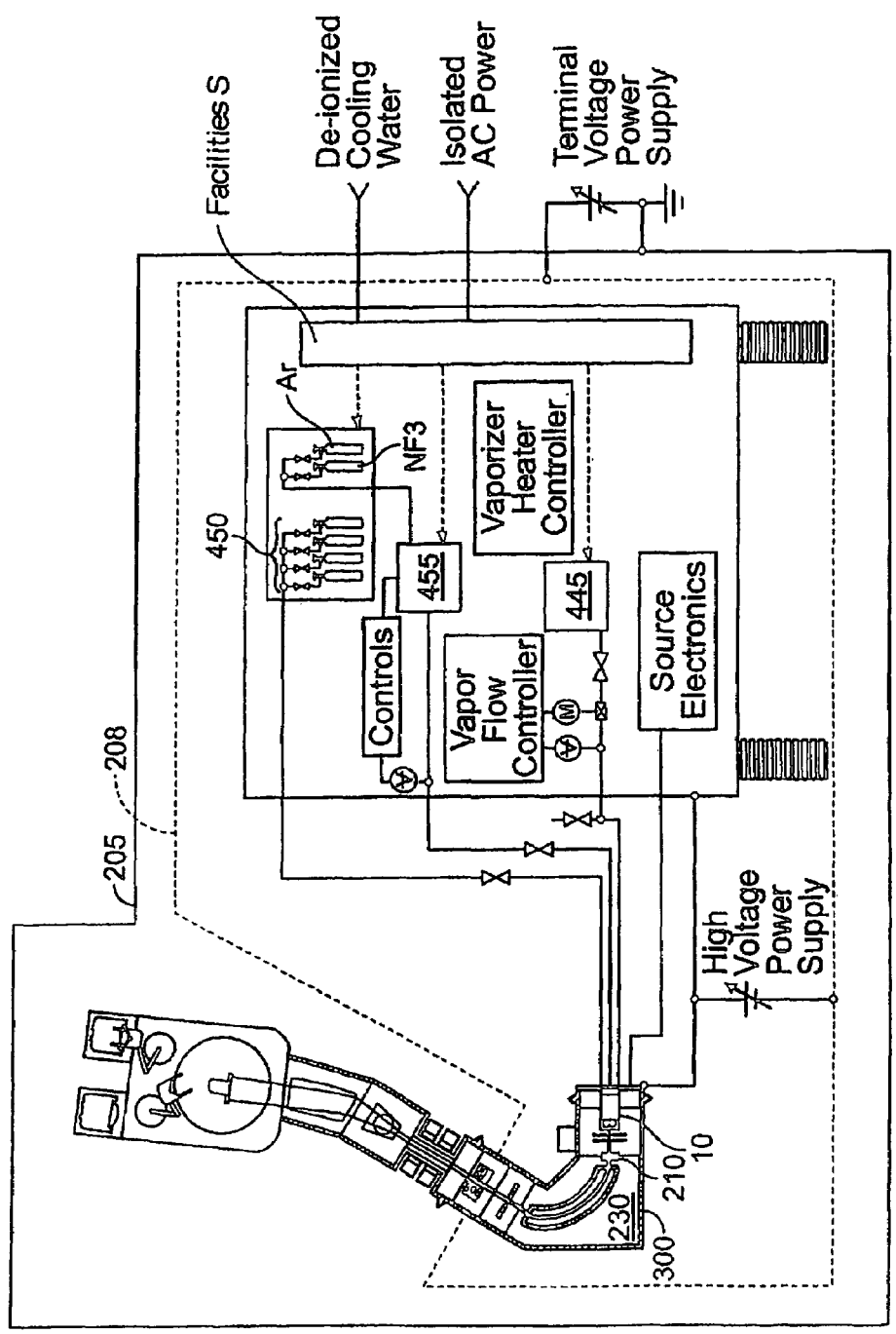
FIG. 6A: View similar to FIG. 6, showing a vapor flow control system.
Figure 6B:
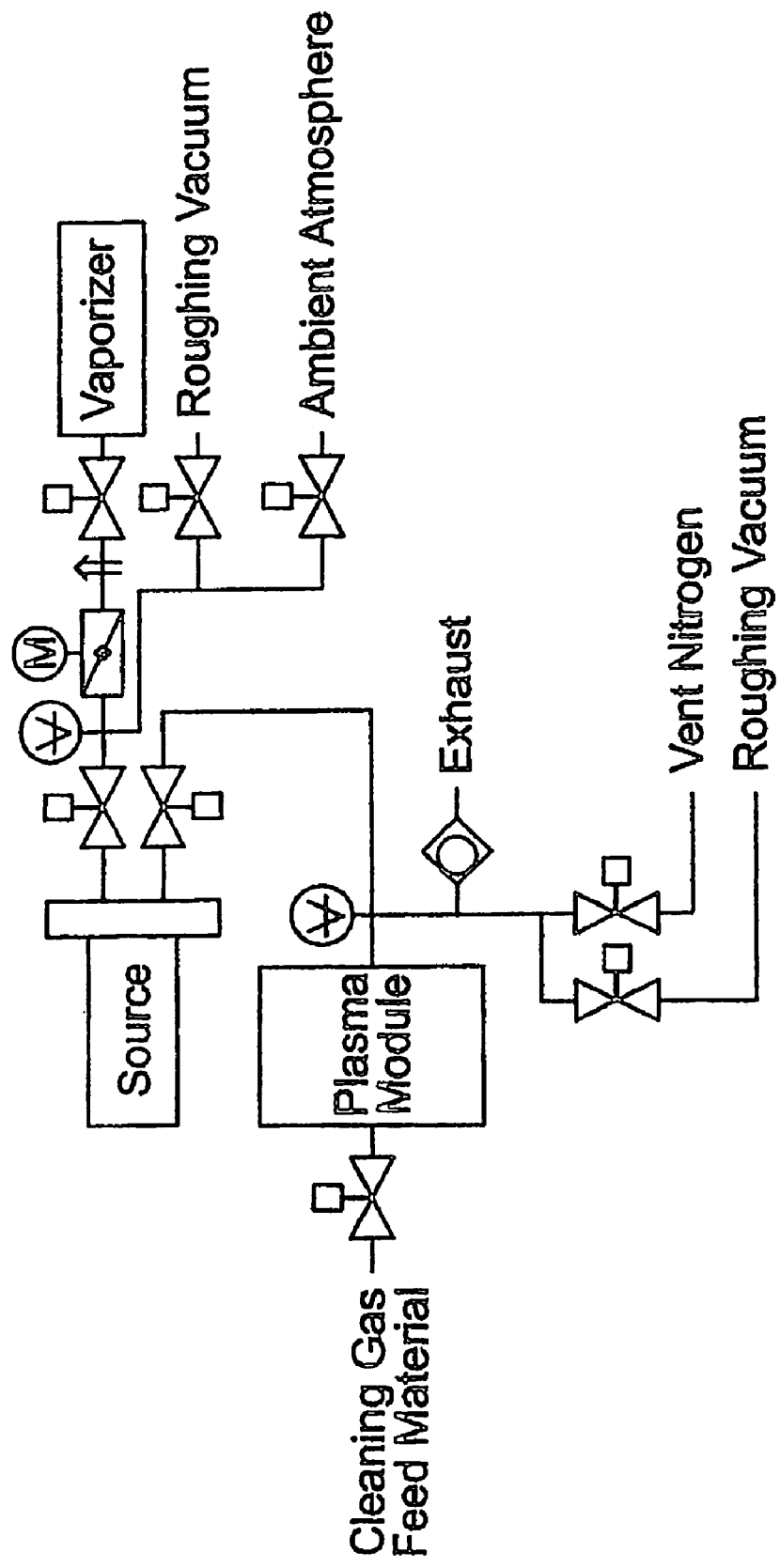
FIG. 6B: Valve schematic for an ion beam generating system.

The embodiment of FIG. 6a differs from the embodiment of FIG. 6 above, by incorporating a preferred vaporizer and flow control system described below. FIG. 6B is a valve schematic diagram for the ion source and self-cleaning system of FIG. 4.

Preferred Ion Source and Vaporizer

Figure 7:
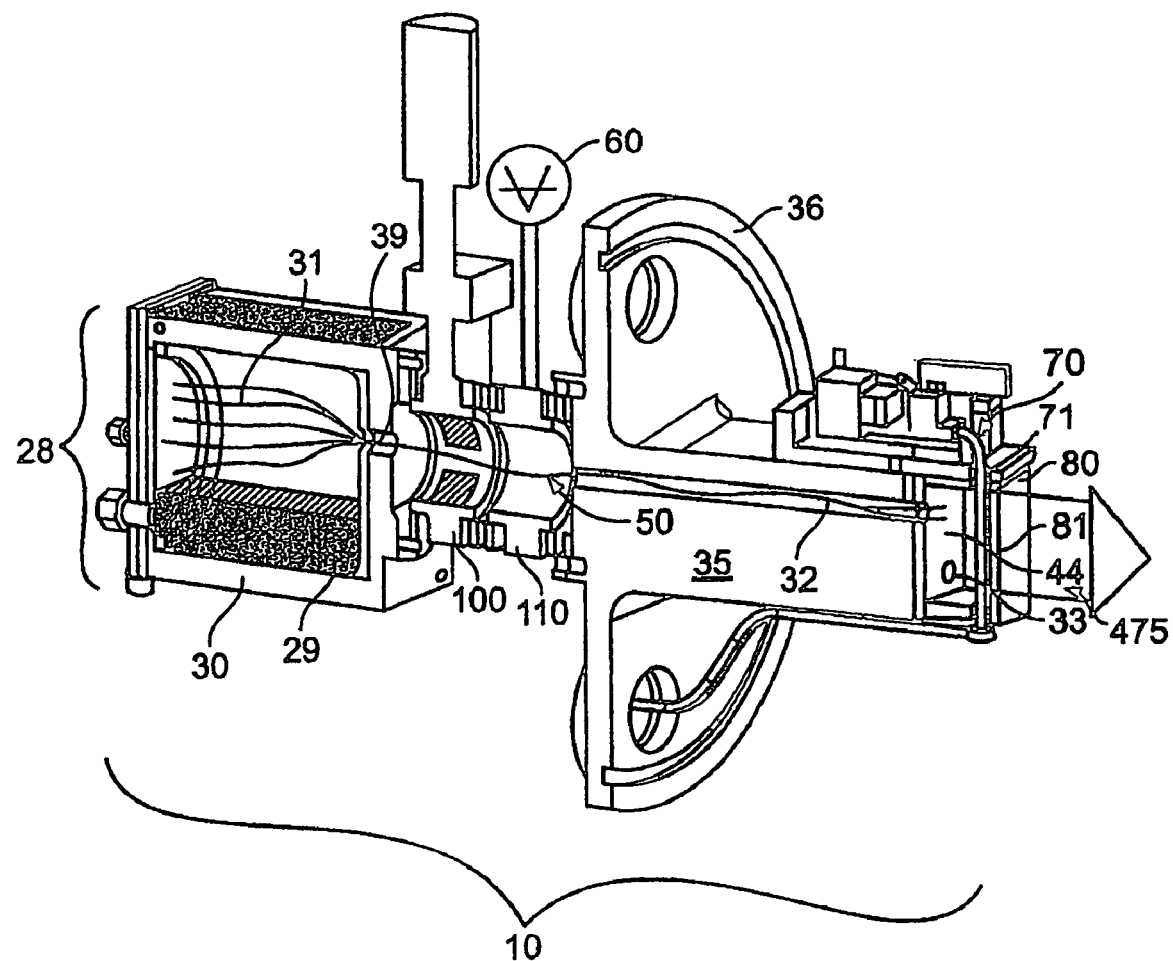
FIG. 7: Electron-impact ion source.
Figure 7A:
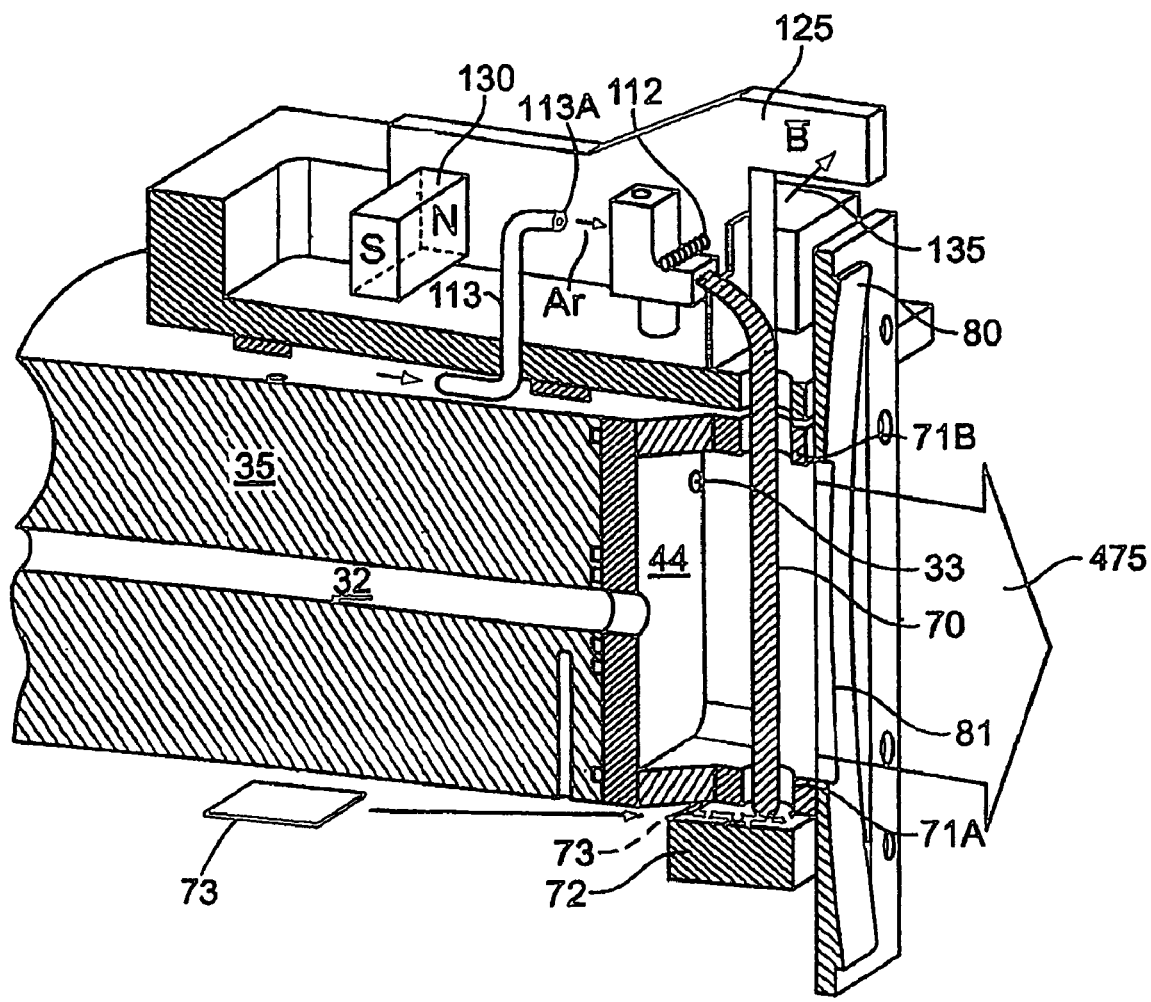
FIG. 7A: Magnified view of a portion of FIG. 7, showing shielding of elements.

FIG. 7 is a diagram of a preferred ion source 10 and its various components, and see FIG. 7A. The details of its construction, as well as its preferred modes of operation, are similar to that disclosed by Horsky et al., International Application No. PCT/US03/20197, filed Jun. 26, 2003: "An ion implantation device and a method of semiconductor manufacturing by the implantation of boron hydride cluster ions", and by Horsky, U.S. patent application Ser. No. 10/183,768, "Electron impact ion source", filed Jun. 26, 2002, both herein incorporated by reference. The ion source 10 is one embodiment of a novel electron impact ionization system. FIG. 7 is a cross-sectional schematic diagram of the source construction which serves to clarify the functionality of the components which make up the ion source 10. The ion source 10 is made to interface to an evacuated vacuum chamber of an ion implanter by way of a mounting flange 36. Thus, the portion of the ion source 10 to the right of flange 36, shown in FIG. 7, is at high vacuum (pressure $<1\times10^{-4}$ Torr). Gaseous material is introduced into ionization chamber 44 in which the gas molecules are ionized by electron impact from electron beam 70, which enters the ionization chamber 44 through electron entrance aperture 71 such that electron beam 70 is aligned with (i.e. extends adjacent, parallel to) ion extraction aperture 81. Thus, ions are created adjacent to the ion extraction aperture 81, which appears as a slot in the ion extraction aperture plate 80. The ions are then extracted and formed into an energetic ion beam 475 by an extraction electrode 220 (FIGS. 8 and 9) located in front of the ion extraction aperture plate 80. Referring to FIG. 7, gases such as argon, phosphine, or arsine, for example, may be fed into the ionization chamber 44 via a gas conduit 33. Solid feed materials 29 such as decaborane or octadecaborane can be vaporized in vaporizer 28, and the vapor fed into the ionization chamber 44 through vapor conduit 32 within the source block 35. Typically, ionization chamber 44, ion extraction aperture plate 80, source block 35 (including vapor conduit 32), and vaporizer housing 30 are all fabricated of aluminum. Solid feed material 29 is held at a uniform temperature by closed-loop temperature control of the vaporizer housing 30. Sublimated vapor 50 which accumulates in a ballast volume 31 feeds through conduit 39 and through throttling valve 100 and shutoff valve 110. The nominal pressure of vapor 50 between throttling valve 100 and shutoff valve 110 is monitored by heated pressure gauge 60, preferably a capacitance manometer. Since the vapor 50 feeds into the ionization chamber 44 through the vapor conduit 32, located in the source block 35, and gases feed in through gas conduit 33, both gaseous and vaporized materials may be ionized by this ion source, which is capable of creating ion beam 475 consisting of either molecular ions (such as $B_{18}H_x^+$) or monomer ions (such as $As^+$), as needed.

Vapor Flow Control Into the Ion Generating System

Figure 7B:
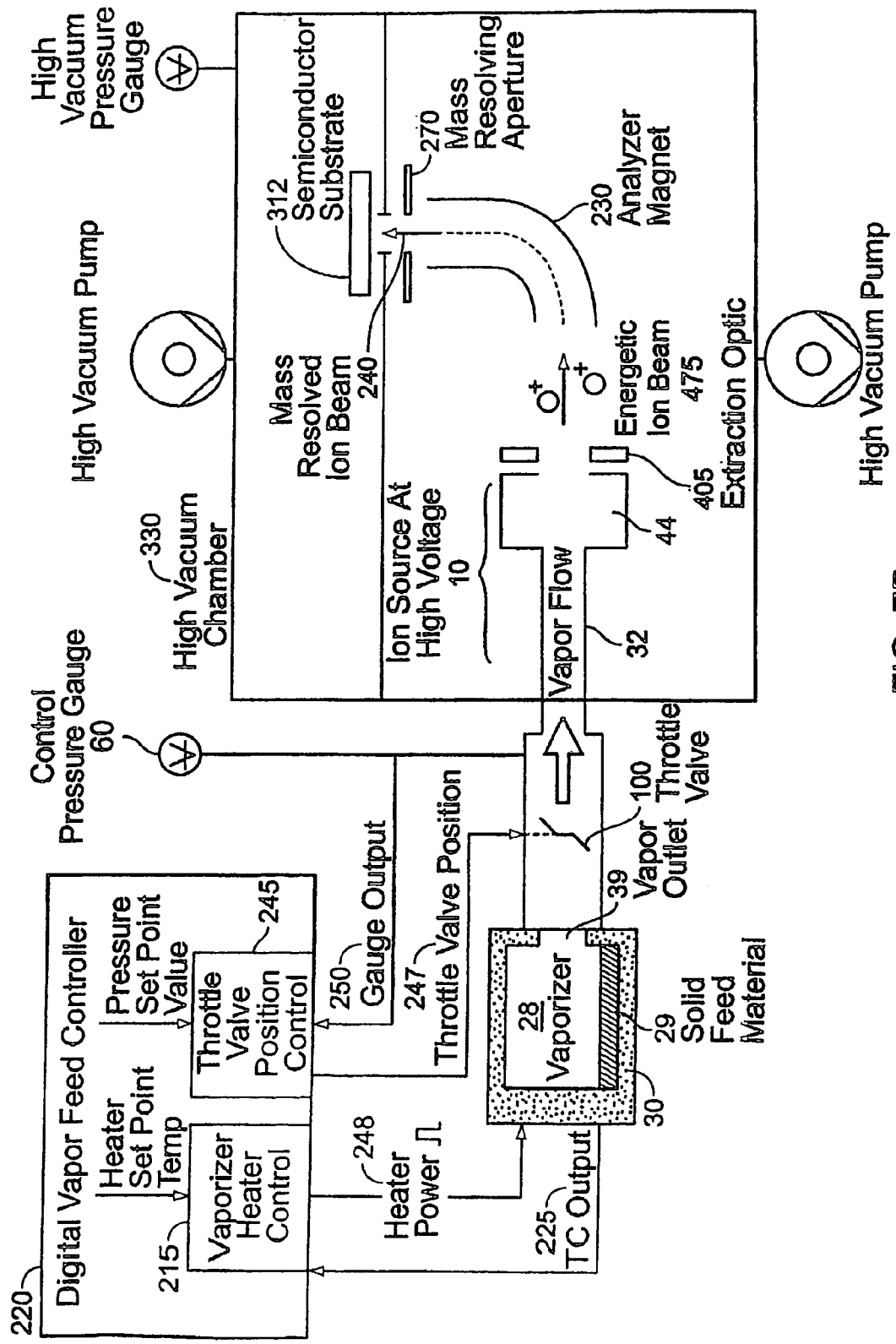
FIG. 7B: Control diagram for an embodiment.

The flow of vapor to ionization chamber of FIG. 7, and see FIG. 7B, is determined by the vapor pressure in the region just before vapor feed passage 32, i.e., within shutoff valve 110 in FIG. 7. This is measured by pressure gauge 60, e.g. a capacitance monometer, located between throttling valve 100 and shut-off valve 110. In general, the flow rate is proportional to the vapor pressure. This allows the pressure signal to represent flow, and to be used as a set point to select flow. To generate a desired vapor flow into the ion source, vaporizer housing 30 is brought to a temperature such that when throttling valve 100 is in its fully open position, the desired flow rate is exceeded. Then the throttling valve 100 is adjusted to reach the desired pressure output.

To establish a stable flow over time, separate closed loop control of the vaporizer temperature and vapor pressure is implemented using dual PID controllers, such as the Omron E5CK control loop digital controller. The control (feedback) variables are thermocouple output for temperature, and gauge output for pressure. The diagram of FIG. 7B shows a digital vapor feed controller 220 for performing these closed loop control functions.

In FIG. 7B gauge output 250 from pressure gauge 60 is applied to throttle valve position control 245 which applies throttle valve position control signal 247 to throttle valve 100. Thermocouple output 225 from vaporizer 28 is applied to vaporizer heater control 215 which controls heater power 248 applied to the vaporizer 28.

A second, slow level of control is implemented by digital feed controller 220, accommodating the rate at which solid feed material vaporizes being a function of its open surface area, particularly the available surface area at the solid-vacuum interface. As feed material within the vaporizer is consumed over time, this available surface area steadily decreases until the evolution rate of vapors cannot support the desired vapor flow rate, resulting in a decrease in the vapor pressure upstream of the throttle valve 100. This is known as "evolution rate limited" operation. So, with a fresh charge of feed material in the vaporizer, a vaporizer temperature of, say, 25C might support the required vapor flow at a nominal throttle valve position at the low end of its dynamic range (i.e., the throttling valve only partially open). Over time (for example, after 20% of the feed material is consumed), the valve position would open further and further to maintain the desired flow. When the throttle valve is near the high conductance limit of its dynamic range (i.e., mostly open), this valve position is sensed by the controller 220, which sends a new, higher heater set point temperature to the vaporizer heater control 215. The increment is selected to restore, once the vaporizer temperature settles to its new value, the nominal throttle valve operating point near the low end of its dynamic range. Thus, the ability of the digital controller 220 to accommodate both short-timescale changes in set point vapor pressure and long-timescale changes in vaporizer temperature makes the control of vapor flow over the lifetime of the feed material charge very robust. Such control prevents over-feeding of vapor to the ionization chamber. This has the effect of limiting the amount of unwanted deposits on surfaces of the ion generating system, thus extending the ion source life between cleanings.

Figure 8:
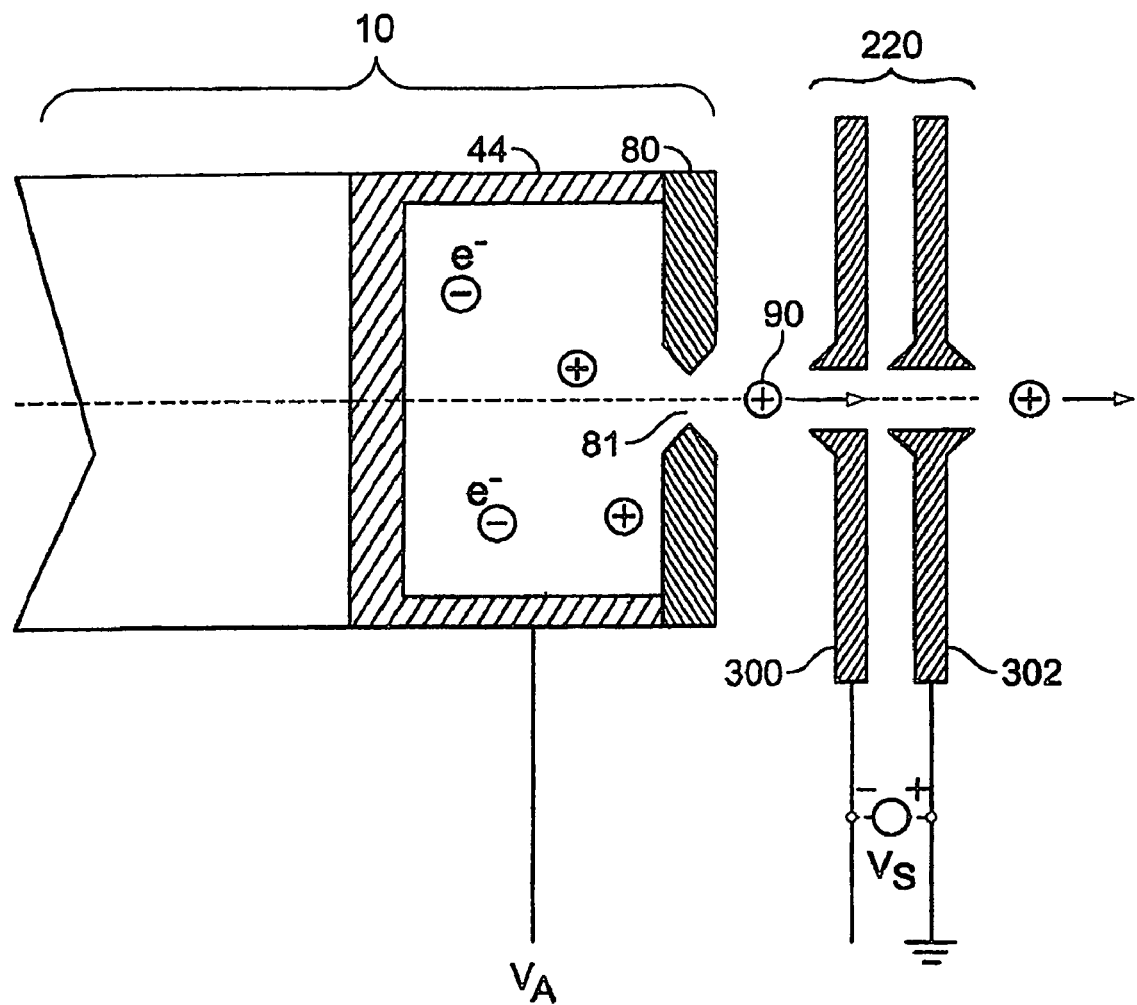
FIG. 8: Ion extraction electrode.

FIG. 8 shows a top view (looking down) of an ion extraction electrode 220 facing the novel ion source 10. The ion source 10 is held at a positive potential $V_A$ with respect to the ion extraction electrode 220, which is at local ground potential, i.e., at the potential of the vacuum housing. The ion extraction electrode 220 is a simple diode; electrode plate 302 is the "ground" electrode and plate 300 the "suppression" electrode, typically held a few thousand volts below ground potential by suppression power supply $V_S$. The ionization chamber 44 and ion extraction aperture plate 80 of ion source 10 are shown facing extraction electrode 220. The three plates 80, 300, 302 contain rectangular slots or apertures through which ions 90 are extracted; FIG. 8 illustrates the slot profiles in the "short", or dispersive, direction.

Novel Heated Electrode

Figure 9:
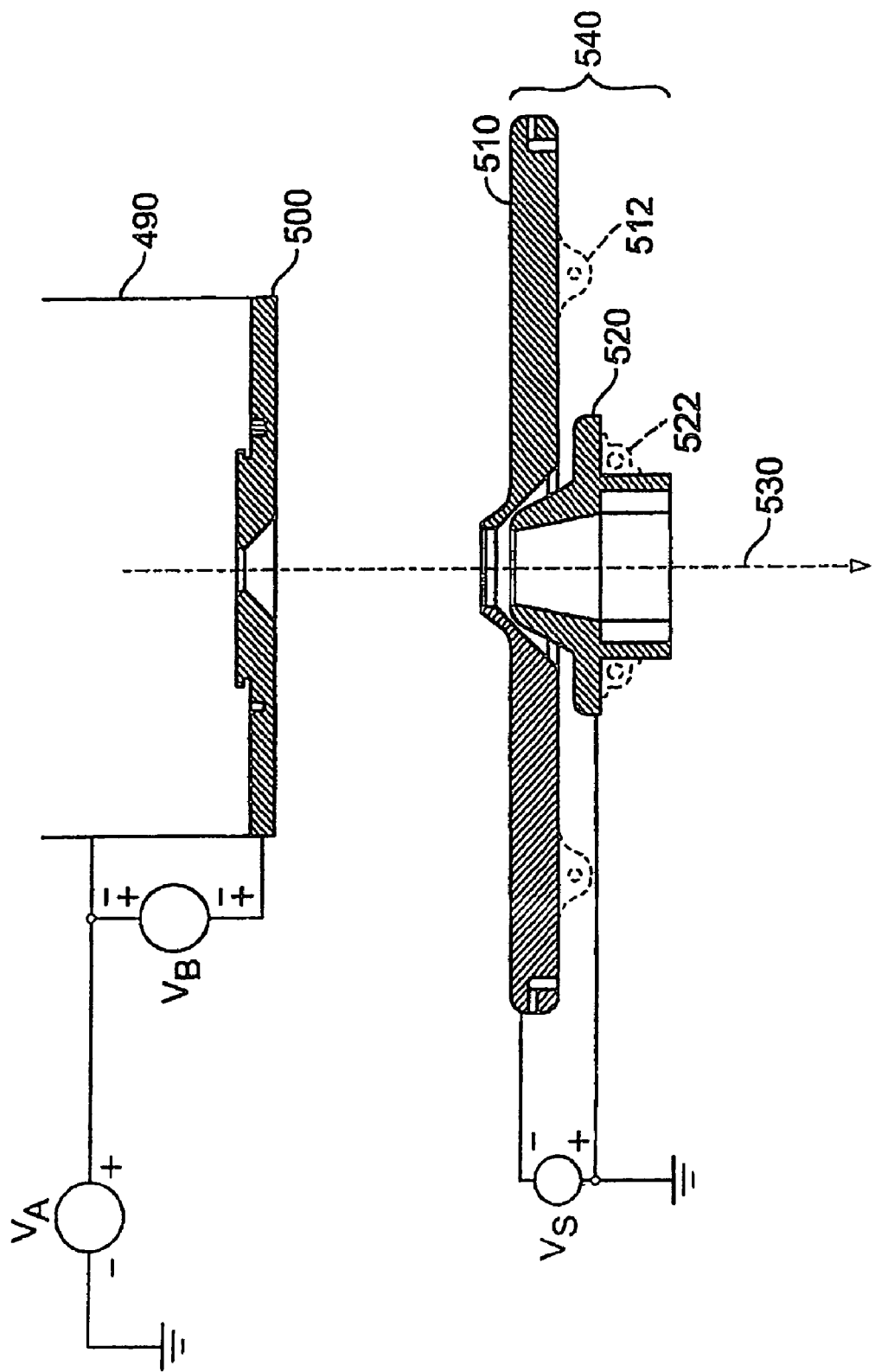
FIG. 9: Ion extraction electrode optics.
Figure 9A:
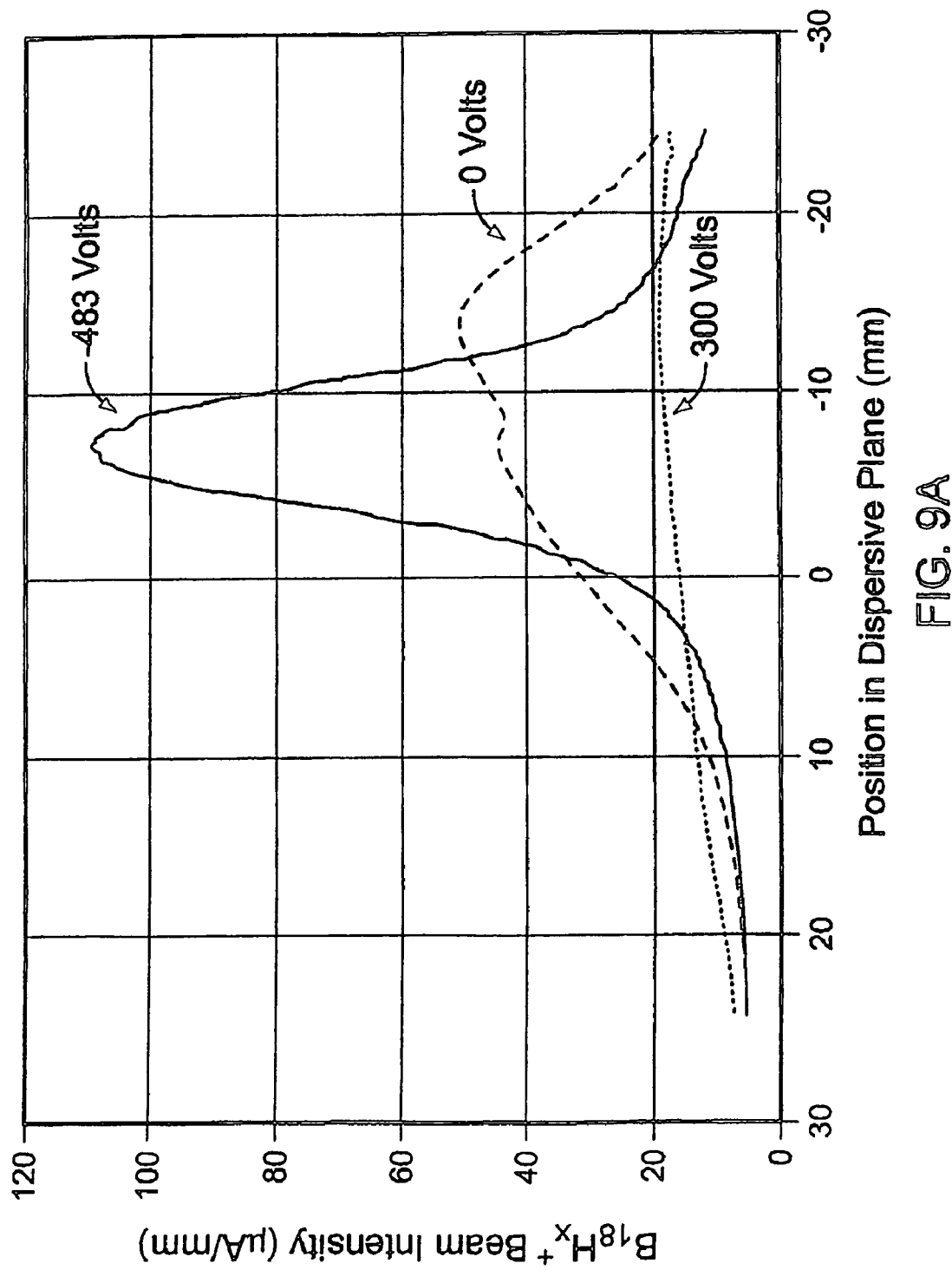
FIG. 9a: $B_{18}H_x^+$ beam profiles.
Figure 10:
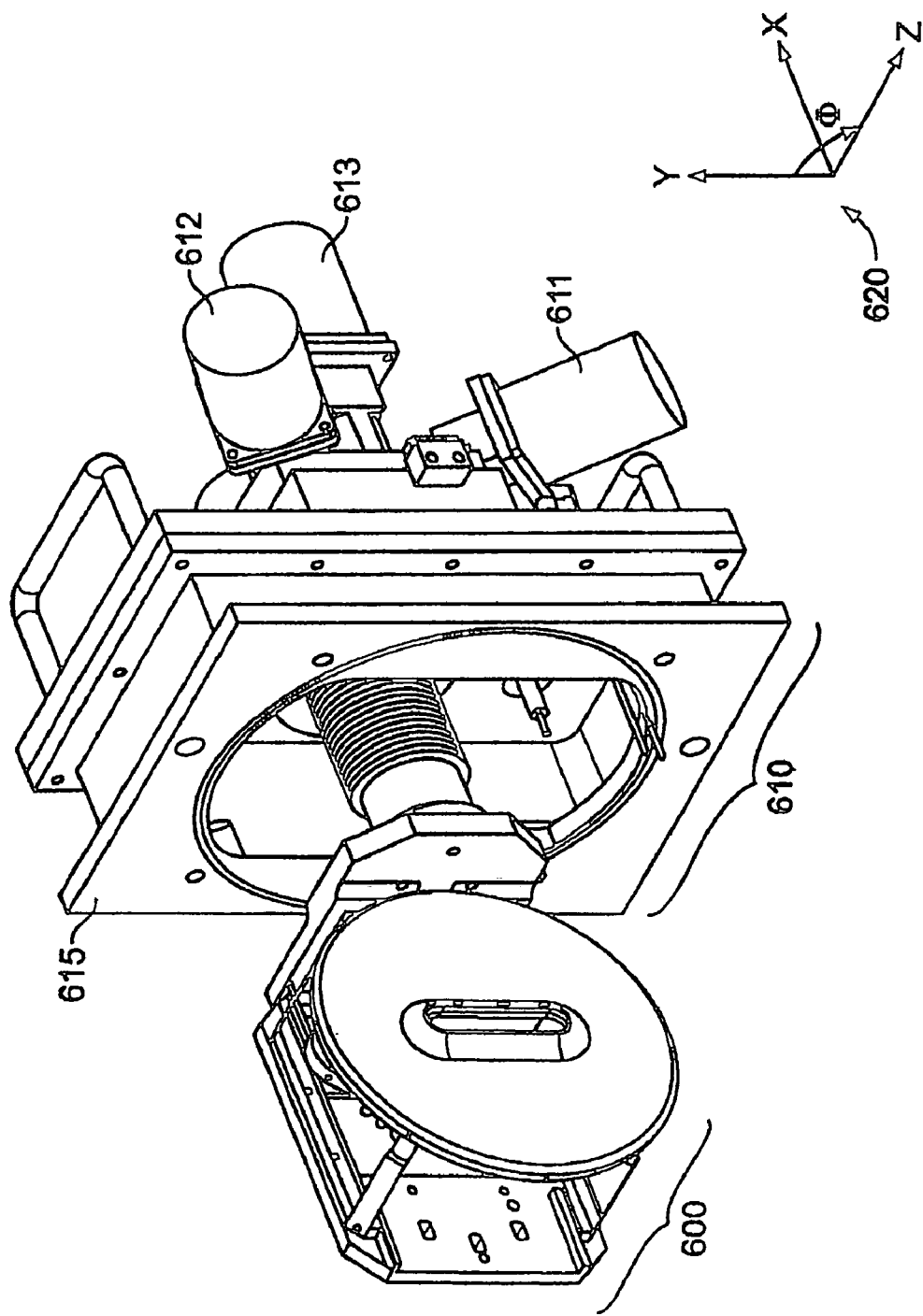
FIG. 10: Extraction electrode and manipulator.
Figure 11:
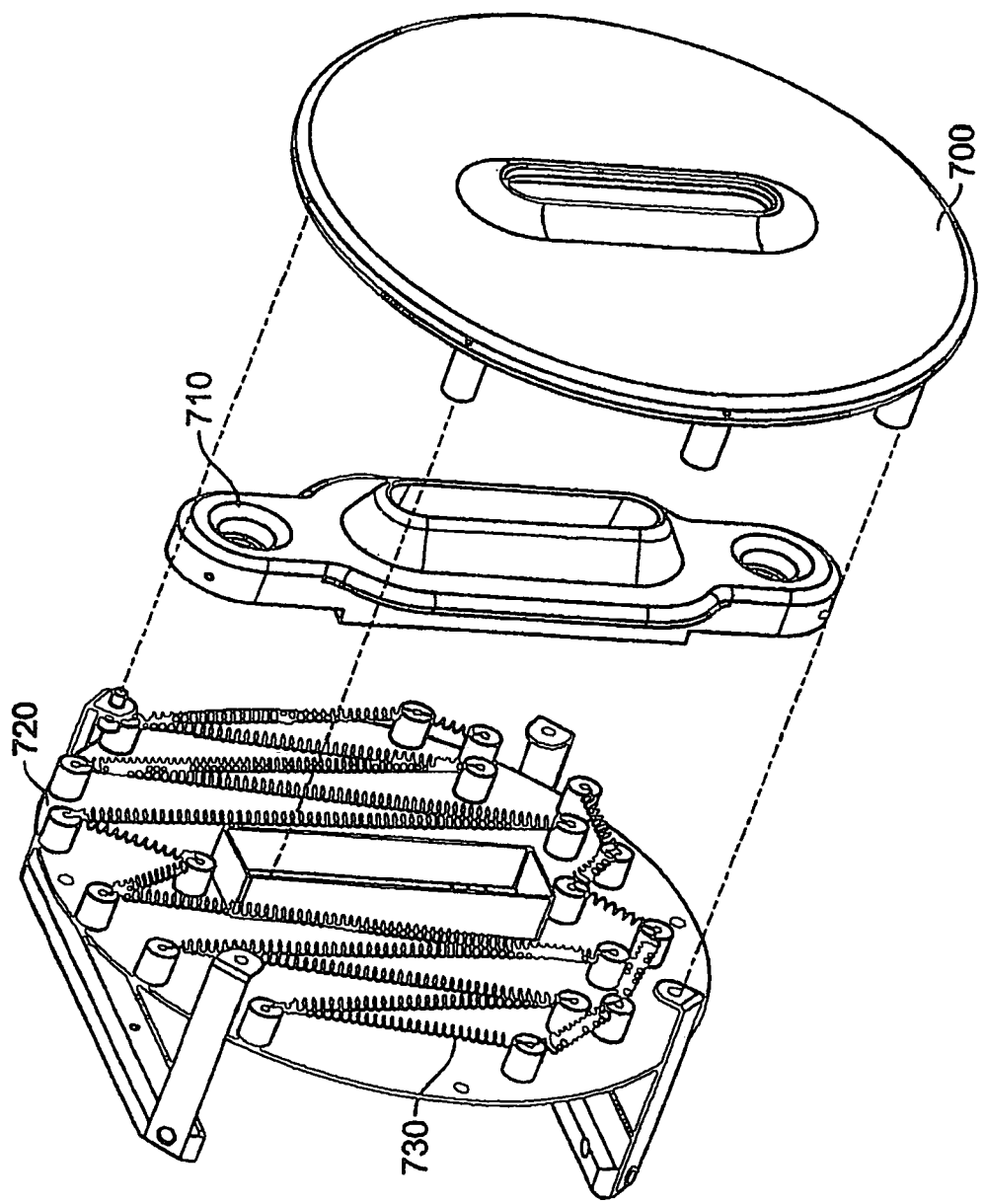
FIG. 11: Electrode head-exploded view.
Figure 12:
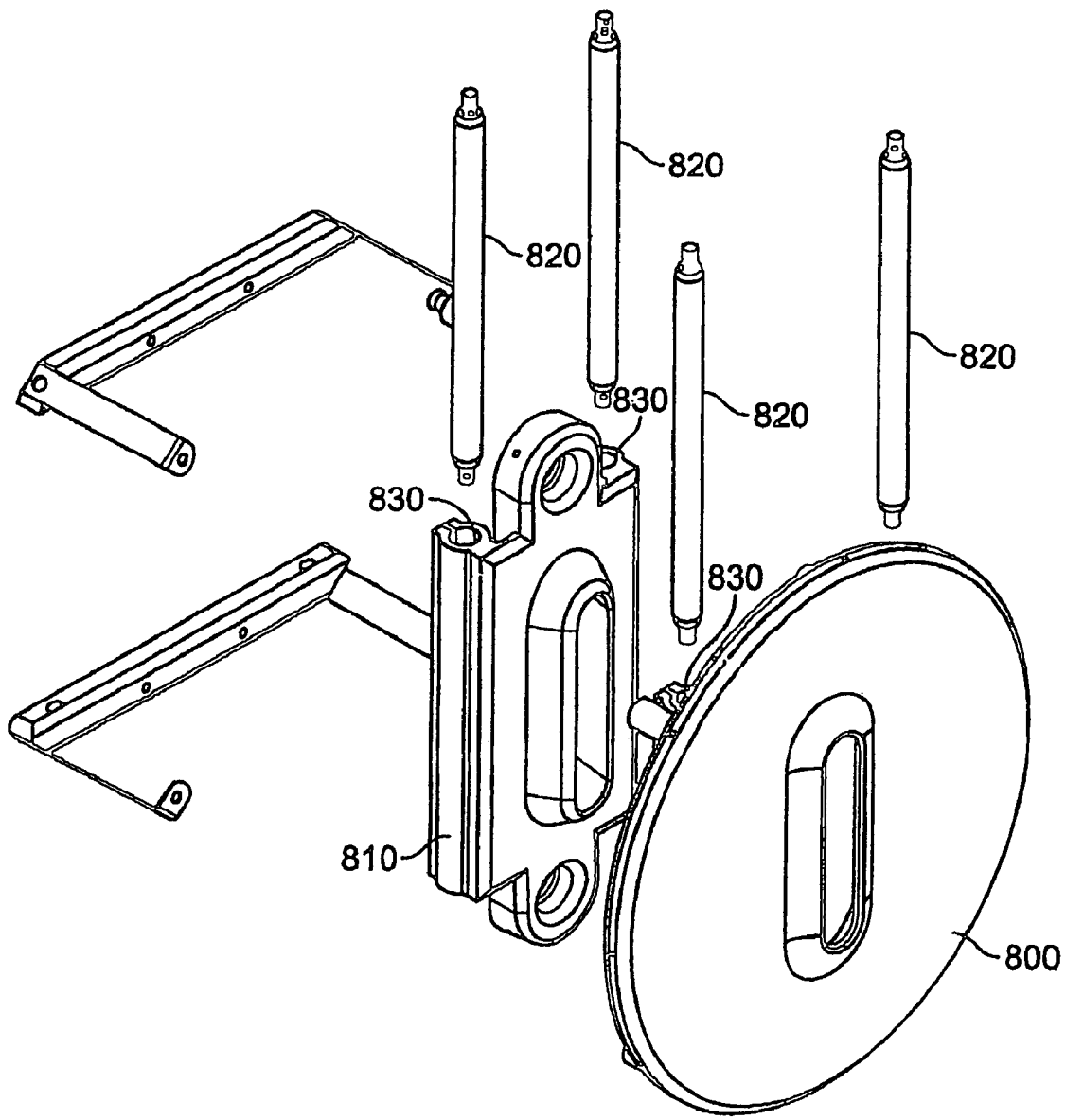
FIG. 12: Second embodiment of electrode head.
Figure 13:
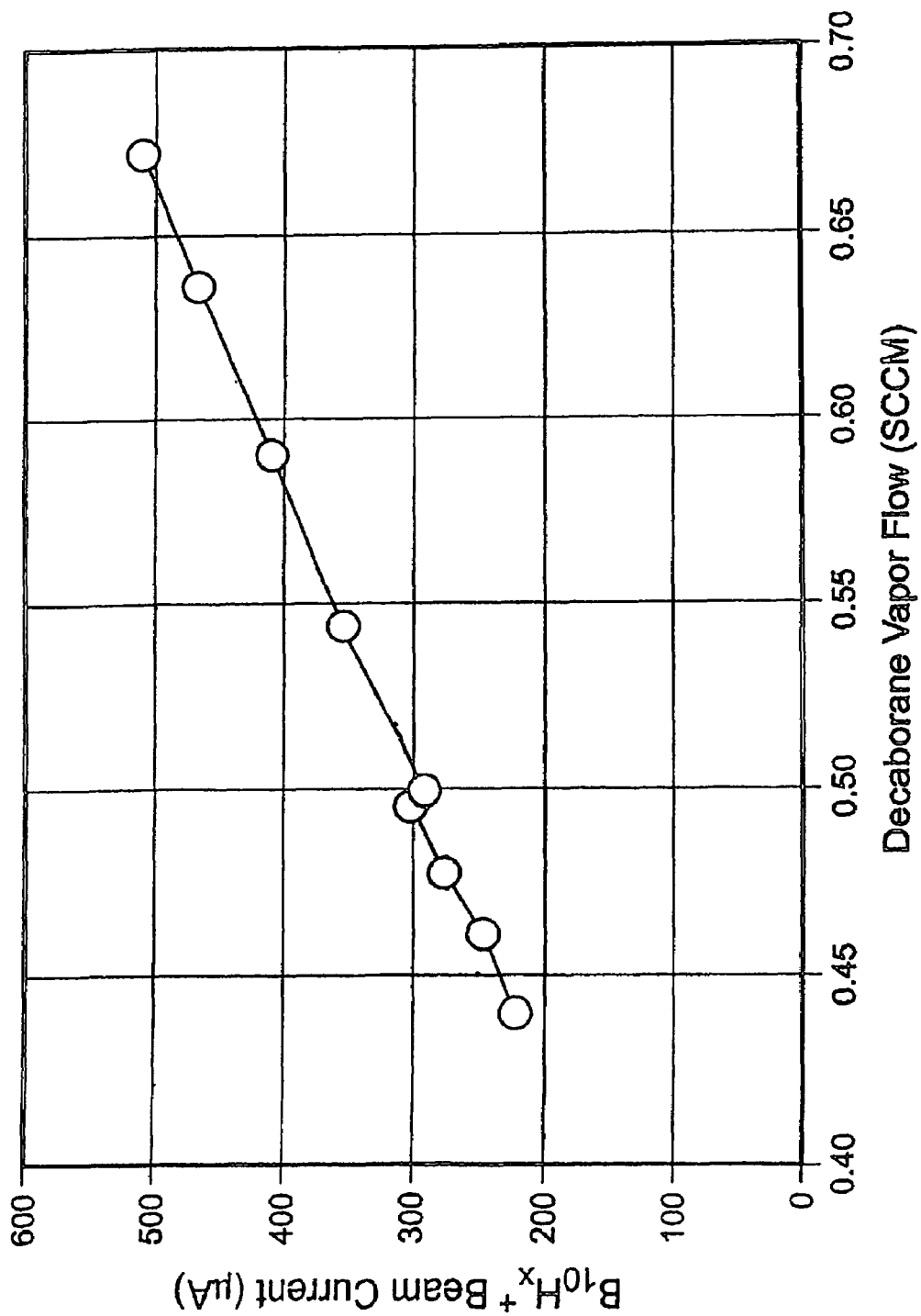
FIG. 13: $B_{10}H_x^+$ beam current versus decaborane flow rate.
Figure 14:
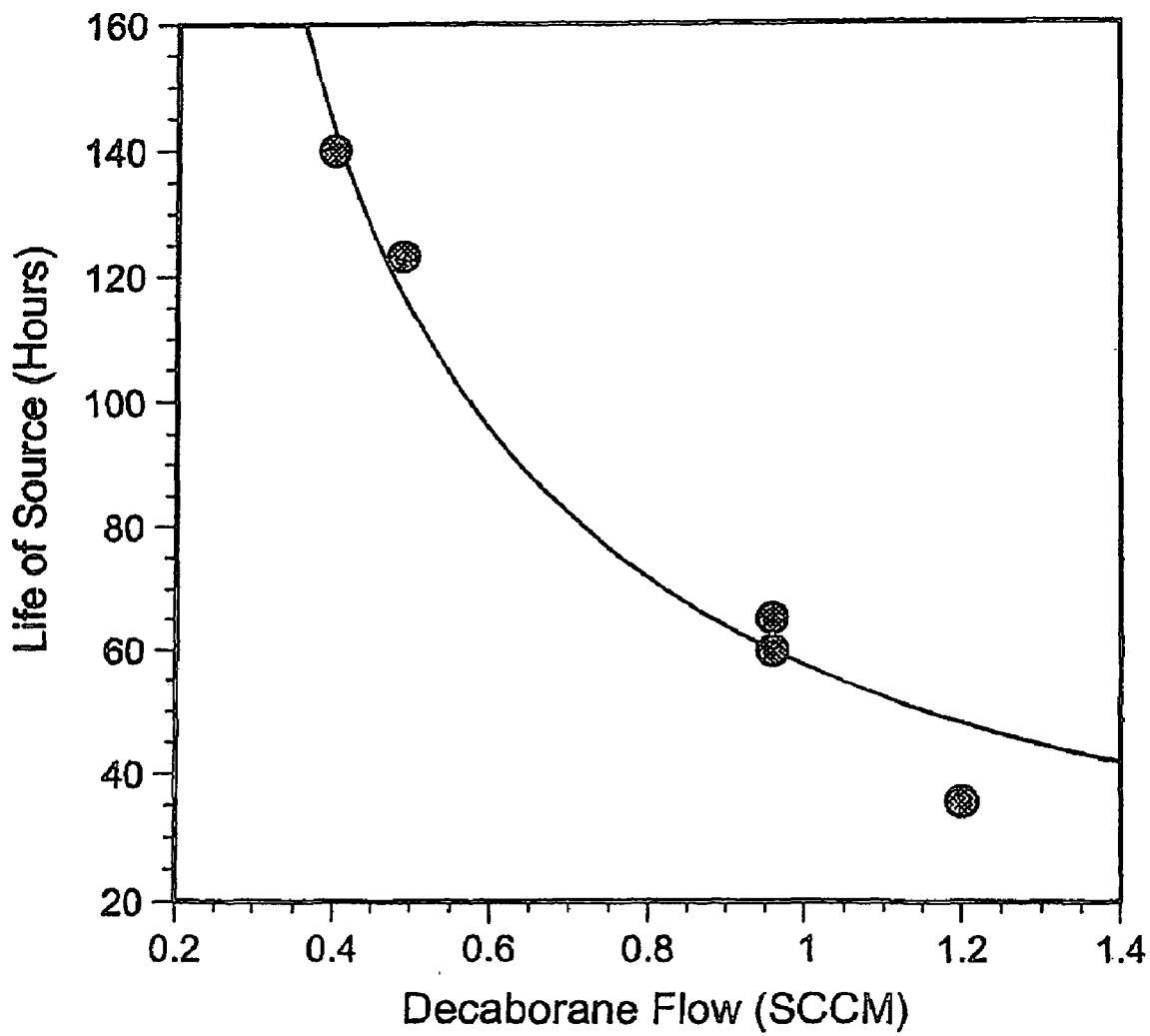
FIG. 14: Lifetime versus decaborane vapor flow rate.
Figure 15:
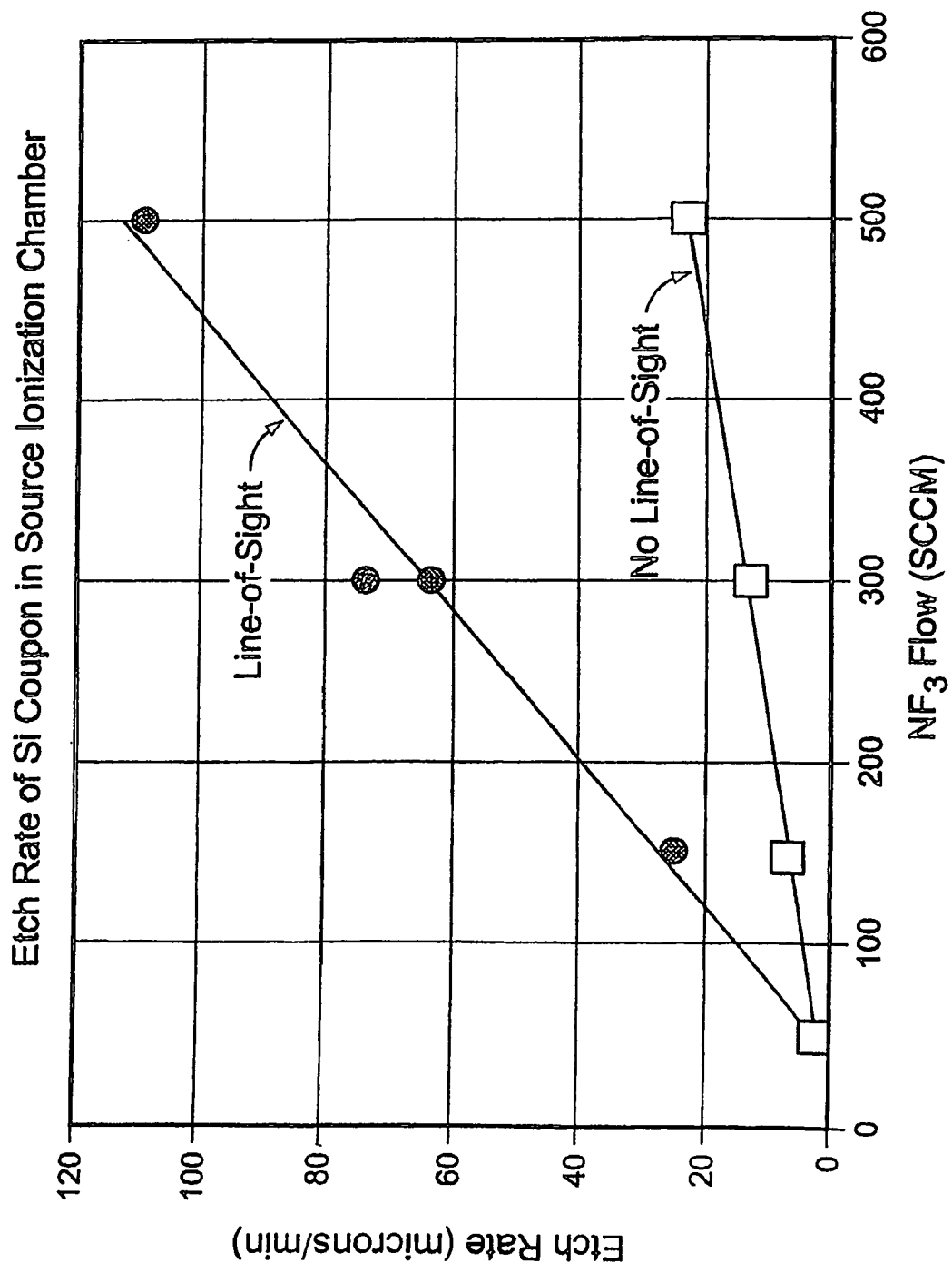
FIG. 15: Etch rate of Si coupon.

During the decaborane lifetime tests shown in FIG. 14, a novel heated aluminum electrode was used. FIG. 9 shows a top view of the basic optical design of the extraction system, in the dispersive plane of the one-dimensional "slot" aperture lenses. In the implanter used, the ionization chamber 490 of the ion source was held at the desired ion beam energy by positive high voltage power supply $V_A$, FIG. 8. For example, if a 20 keV ion beam is desired, then $V_A$=20 kV. Ion extraction aperture plate 500 is electrically isolated from ionization chamber 490 such that it can be biased by bipolar power supply $V_B$ from –750V-750V. The isolation is accomplished by a thermally conductive, electrically insulating polymeric gasket which is sandwiched between the ion extraction aperture plate 500 and ionization chamber 490. The parts of the ion source body that are exposed to vapor (source block 35, ionization chamber 44, and extraction aperture plate 80 in FIG. 7) are maintained in good thermal contact with each other to maintain

The invention claimed is:

1. A reactive gas cleaning system for cleaning an ion source having an ion source and an extraction electrode, said reactive gas cleaning system comprising:
 a plasma chamber arranged to receive a feed gas capable of being disassociated by plasma to produce a flow of reactive gas;
 a chamber outlet formed on said plasma chamber; and
 a conduit for transporting the reactive gas to the ionization chamber, wherein said reactive gas cleaning system is operable when the ionization chamber is de-energized to provide a flow of reactive gas through the ionization chamber and through the ion extraction aperture to react with and remove deposits on at least some of the surfaces thereof.

2. The reactive gas cleaning system as recited in claim 1, wherein said reactive gas cleaning system is constructed to produce a flow of the reactive gas into the ionization chamber at a flow rate of less than about 2 Standard Liters Per Minute.

3. The reactive gas cleaning system as recited in claim 1, wherein said the plasma chamber is constructed and arranged to receive and disassociate a compound capable of being disassociated to atomic fluorine.

4. The reactive gas cleaning system as recited in claim 3, wherein said compound is selected from the group consisting of(NF3, C3F8 and CF4).

5. The reactive gas cleaning system as recited in claim 1, further including an end-point detection system which detects substantial completion of reaction of the reactive gas with contamination on a surfaces being cleaned.

6. The reactive gas cleaning system as recited in claim 5, said end point detection system includes an analysis system for detecting the chemical makeup of the gas that has been exposed to the surface to be cleaned.

7. The reactive gas cleaning system as recited in claim 6, further including a temperature detector arranged to detect substantial termination of an exothermic reaction of the reactive gas with contamination on a surface of the system.

8. The reactive gas cleaning system as recited in claim 1, wherein said reactive gas is a halogen gas.

9. The reactive gas cleaning system as recited in claim 1, wherein said reactive gas cleaning system generates fluorine, F, ions to the ionization chamber for cleaning deposits from the surfaces to be cleaned.

10. The reactive gas cleaning system as recited in claim 1, wherein said reactive gas cleaning system generates chlorine Cl, ions to the ionization chamber for cleaning deposits from the surfaces to be cleaned.

11. The reactive gas cleaning system as recited in claim 1, wherein said reactive gas cleaning system is configured to remove deposits after the ion source has ionized decaborane, $B_{10}H_{14}$.

12. The reactive gas cleaning system as recited in claim 1, wherein said reactive gas cleaning system is configured to remove deposits after the ion source has ionized octadecaborane, $B_{18}H_{22}$.

13. The reactive gas cleaning system as recited in claim 1, wherein said reactive gas cleaning system is configured to remove deposits after the ion source has ionized arsenic-containing compounds, such as arsine, $AsH_3$.

14. The reactive gas cleaning system as recited in claim 1, wherein said reactive gas cleaning system is configured to remove deposits after the ion source has ionized arsenic-containing compounds, such as elemental arsenic, As.

15. The reactive gas cleaning system as recited in claim 1, wherein said reactive gas cleaning system is configured to remove deposits after the ion source has ionized phosphorus-containing compounds, such as elemental phosphorus, P.

16. The reactive gas cleaning system as recited in claim 1, wherein said reactive gas cleaning system is configured to remove deposits after the ion source has ionized phosphorus-containing compounds, such as or phosphine, $PH_3$.

17. The reactive gas cleaning system as recited in claim 1, wherein said reactive gas cleaning system is configured to remove deposits after the ion source has ionized antimony-containing compounds, such as trimethylantimony, $Sb(CH_4)_3$.

18. The reactive gas cleaning system as recited in claim 1, wherein said reactive gas cleaning system is configured to remove deposits after the ion source has ionized antimony-containing compounds, such as antimony pentaflouride, $SbF_5$.

19. The reactive gas cleaning system as recited in claim 1, wherein said reactive gas is a fluorine gas.

20. The reactive gas cleaning system as recited in claim 19, wherein said fluorine gas is produced in the plasma chamber by a $NF_3$ plasma.

21. The reactive gas cleaning system as recited in claim 19, wherein said fluorine gas is produced in the plasma chamber by a $C_3F_8$ plasma.

22. The reactive gas cleaning system as recited in claim 19. wherein said fluorine gas is produced in the plasma chamber by a $CF_4$ plasma.

* * * * *